(12) United States Patent  (10) Patent No.: US 7,695,838 B2
Komachiya et al.  (45) Date of Patent: *Apr. 13, 2010

(54) FUEL CELL SYSTEM AND DIAGNOSIS SYSTEM FOR THE FUEL CELL SYSTEM

(75) Inventors: Masahiro Komachiya, Hitachinaka (JP); Hiroshi Yamauchi, Hitachi (JP); Katsunori Nishimura, Hitachiota (JP); Kou Takahashi, Hitachi (JP); Yoshinari Hori, Hitachinaka (JP); Yoshihide Kondo, Ondo (JP)

(73) Assignee: Hitachi, Ltd. (JP)

( * ) Notice: Subject to any disclaimer, the term of this patent is extended or adjusted under 35 U.S.C. 154(b) by 982 days.

This patent is subject to a terminal disclaimer.

(21) Appl. No.: 11/244,237

(22) Filed: Oct. 6, 2005

(65) Prior Publication Data

US 2007/0196707 A1 Aug. 23, 2007

(30) Foreign Application Priority Data

Oct. 6, 2004 (JP) .............................. 2004-293425

(51) Int. Cl.
H01M 8/04 (2006.01)
H01M 8/12 (2006.01)

(52) U.S. Cl. ...................................................... 429/23

(58) Field of Classification Search ............... 429/22–25
See application file for complete search history.

(56) References Cited

U.S. PATENT DOCUMENTS

| 5,085,949 | A | * | 2/1992 | Sanderson et al. | ............ 429/23 |
| 5,345,358 | A | * | 9/1994 | Kumar | ........................ 361/78 |
| 5,675,091 | A | * | 10/1997 | Lew et al. | ................ 73/861.22 |
| 6,322,917 | B1 | * | 11/2001 | Acker | .......................... 429/17 |
| 6,511,765 | B2 | * | 1/2003 | Ueno et al. | .................... 429/22 |
| 2003/0022038 | A1 | * | 1/2003 | Vaal et al. | ..................... 429/22 |
| 2004/0185316 | A1 | * | 9/2004 | Wells et al. | .................... 429/22 |

FOREIGN PATENT DOCUMENTS

JP  2004-127915  4/2004

* cited by examiner

*Primary Examiner*—Patrick Ryan
*Assistant Examiner*—Muhammad Siddiquee
(74) *Attorney, Agent, or Firm*—Antonelli, Terry, Stout & Kraus, LLP.

(57) ABSTRACT

A part of cell stack portions constituting a part of a fuel cell stack is used as a voltage detection portion, the size of a frequency component belonging to a predetermined specific frequency range is extracted from a voltage signal detected and the existence/absence of abnormality of a fuel cell system is diagnosed on the basis of the frequency component extracted.

22 Claims, 10 Drawing Sheets

FUEL CELL SYSTEM AND DIAGNOSIS SYSTEM FOR THE FUEL CELL SYSTEM

BACKGROUND OF THE INVENTION

This invention relates to a fuel cell system having fuel cell stacks and its diagnosis system. More particularly, the invention relates to a fuel cell system using PEFC (Polymer Electrolyte Fuel Cells).

A method that divides a large number of cells constituting a fuel cell stack into a plurality of cell groups, measures an output voltage for each cell group and diagnoses an operating condition on the basis of a mean voltage of the output voltages, voltage fluctuation and the value of the output voltage for each cell group has been proposed as one of technologies for the fuel cell system and its diagnosis system. JP-A-2004-127915, for example, discloses in its Abstract a system having a cell monitor capable of monitoring a voltage of each cell group as a fuel cell system that is applied to an electric motor car.

SUMMARY OF THE INVENTION

The system of JP-A-2004-127915 can monitor the voltage throughout the entire fuel cell stack but the monitor positions must be decreased to satisfy the requirement for system simplification in a practical system. When the number of monitor positions is decreased, however, there occurs the problem that information to be detected is spoiled. In other words, there remains the problem how to reduce the number of monitor positions and at the same time, to appropriately secure information to be detected.

It is an object of the invention to acquire necessary detection information even when the number of monitor positions is decreased in abnormality diagnosis of a fuel cell system.

Namely, an object of the invention is to provide a fuel cell system including a fuel cell stack, comprising a voltage detection portion using at least one set of cell stack portions constituting a part of a fuel cell stack as a detection portion and a diagnosis portion for extracting a frequency component within a predetermined frequency range from a voltage detected by the voltage detection portion and diagnosing the existence/absence of abnormality of the fuel cell stack or the system containing the fuel cell stack from the size of the frequency component.

It is another object of the invention to provide a diagnosis system for diagnosing a fuel cell system comprising the steps of detecting a voltage by using at least one set of cell stack portions constituting a part of a fuel cell stack as a detection portion, extracting a frequency component of a predetermined frequency range from the voltage so detected and diagnosing the existence/absence of abnormality of the fuel cell stack or a system containing the fuel cell stack on the basis of the size of the frequency component.

The invention can acquire necessary detection information in the diagnosis of the fuel cell and the fuel cell system even when the number of monitor positions is decreased.

The above and other objects, features and advantages of the invention will become more apparent from the following embodiments of the invention when taken in conjunction with the accompanying drawings.

DESCRIPTION OF THE EMBODIMENTS

Figure 1:
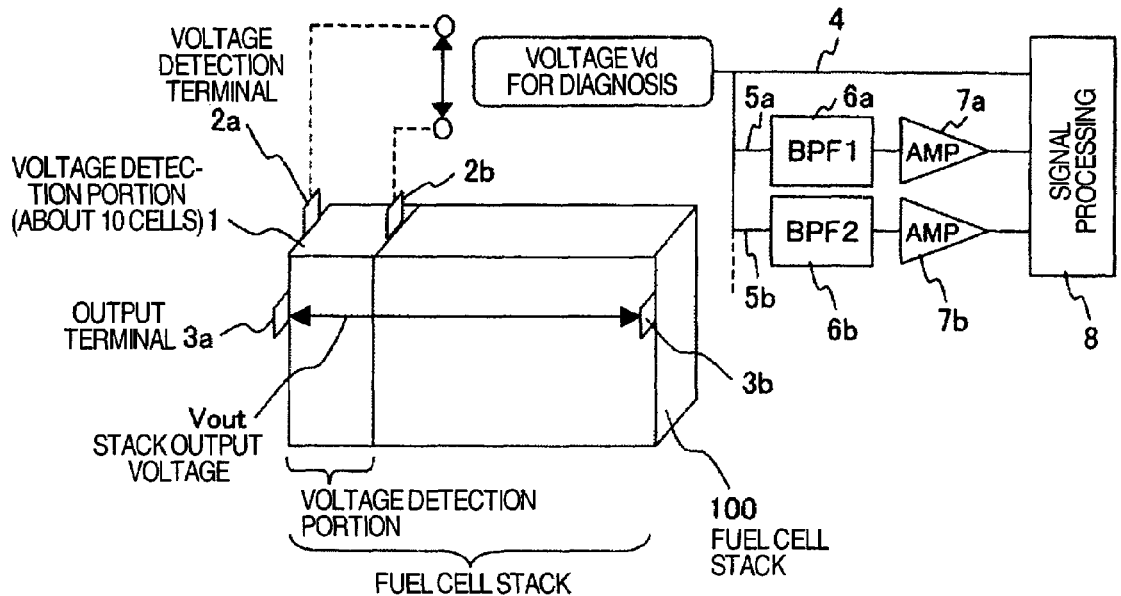
FIG. 1 is a schematic view showing a fuel cell stack and a voltage detection portion for diagnosis according to an embodiment of the invention.

In the invention, the term "frequency component in predetermined frequency range" means a voltage signal component that characterizingly appears in a voltage signal detected from a voltage detection portion or in a voltage signal component falling within a range in which a signal significantly becomes great when abnormality to be detected appears in a fuel cell system or in a fuel cell stack.

The invention uses a cell stack portion of only a part of a fuel stack as a voltage detection portion (voltage monitor) instead of dividing the entire fuel cell stacks into monitor cell groups and simplifies a structure required for diagnosis. In addition, the magnitude of the frequency component belonging to a predetermined specific frequency range is extracted from the detected voltage signal and is diagnosed so that detection can be made highly accurately from a stage at which the occurrence of abnormality is still less. It is thus possible to prevent information to be detected from being spoiled.

The embodiments of the invention are briefly as follows.

(1) An embodiment of the invention uses at least one set of cell stack portions constituting a part of a fuel cell stack as a voltage detection portion, extracts frequency components of at least two predetermined frequency ranges from the voltage detected by the voltage detection portion and diagnoses the existence/absence of abnormality of the fuel cell stack or a fuel system containing the fuel cell stack from the size of the frequency component.

In this embodiment, when the magnitudes of a plurality of frequency components peculiar to the system and to the stack are detected and caught by extraction from the detection signal, comparison between the frequency components extracted and confirmation of their correlation can be confirmed. Consequently, noise components of the background and the signals belonging to the frequency ranges to be detected can be easily separated and correct abnormality diagnosis can be made.

(2) In another embodiment, at least one set of cell stack portions constituting a part of the fuel cell stack are used as a voltage detection portion, frequency components of at least two predetermined frequency ranges are extracted from the voltage detected from the voltage detection portion and at least one of the frequency components is used for abnormality diagnosis of the fuel cell stack while at least one of the other frequency components is used for abnormality diagnosis of a hydrogen production apparatus (reformer).

(3) At least one control signal associated with a fuel feed portion, the reformer and its control portion, the fuel cell stack, a heat recovery system and its control portion and a power conditioner of the fuel cell system is allowed to overlap with predetermined frequency components for a predetermined period of time, at least one set of cell stack portions constituting a part of the fuel cell stack are used as a detection portion, frequency components of frequency ranges containing the frequency are extracted from the voltages detected by the detection portion for a predetermined range and the existence/absence of the fuel cell stack or the system containing the fuel cell stack is diagnosed on the basis of the frequency components.

The embodiments (2) and (3) take into specific consideration the phenomenon that abnormality of each portion of the system appears in many cases as voltage abnormality of the cell stack. The existence/absence of each portion of the system is characterizingly associated with the main frequency component and is diagnosed in not only the cell stack but also the reformer, auxiliaries and a cooling water system.

(4) The invention provides a fuel cell system for diagnosing the existence/absence of abnormality of a fuel cell stack or a system including the fuel cell system from the voltage detected by a voltage detection portion constituting a part of the fuel cell stack by using at least one set of cell stack portions as the voltage detection portion, wherein the voltage detection portion is provided to at least one of the end portions of the fuel cell stacks.

When the number of voltage detection portions (voltage monitors) is decreased, the voltage detection portions are preferably arranged at positions at which the occurrence of abnormality can be detected as soon as possible. Since the end portion of the fuel cell stack is generally susceptible to influences of an external temperature, the voltage detection portion is disposed at this position.

(5) The invention provides a fuel cell system for diagnosing the existence/absence of abnormality of a fuel cell stack or a system including the fuel cell system from the voltage detected by a voltage detection portion by using at least one set of cell stack portions constituting a part of the fuel cell stack as the voltage detection portion, wherein the voltage detection portion is provided to a separator of the fuel cell stack and detects the voltage.

Since the detection terminals necessary for the voltage detection are in advance provided to the separator of the fuel cell stack, voltage detection for the diagnosis can be made without changing the size of the cell stack in the stacking direction.

(6) The invention provides a fuel cell system for diagnosing the existence/absence of abnormality of a fuel cell stack or a system including the fuel cell system from the voltage detected by a voltage detection portion by using at least one set of cell stack portions constituting a part of the fuel cell stack as the voltage detection portion, wherein at least one voltage detection intermediate plate is inserted into the fuel cell stack and detects the voltage.

Since the voltage for diagnosis is detected between a current collector plate provided in advance to the fuel cell stack and the voltage detection intermediate plate, it becomes possible to reduce the occurrence of wiring and connection defects with time and to reliably detect the voltage by a simple method of inserting one intermediate plate.

(7) The invention provides a fuel cell system for diagnosing the existence/absence of abnormality of a fuel cell stack or a system including the fuel cell system from the voltage detected by a voltage detection portion by using at least one set of cell stack portions constituting a part of the fuel cell stack as the voltage detection portion, wherein the number of cells contained in the voltage detection portion is not greater than 20 cells, preferably not greater than 10 cells.

When an excessively large number of cells are contained in the voltage detection portion, variance of each cell (oscillation component) is averaged time-wise and correct detection of abnormality in the frequency range becomes difficult. It has been clarified as a result of various studies that the number of cells contained in the voltage detection portion is not greater than 20 cells, preferably not greater than 10 cells. In this way, the abnormality diagnosis can be made appropriately with a smaller number of voltage detection portions.

(8) The invention provides a fuel cell system for diagnosing the existence/absence of abnormality of a fuel cell stack or a system from the voltage detected by using at least one set of cell stack portions constituting a part of the fuel cell stack as a detection portion, wherein a voltage detection portion is provided to at least one of the end portions of the fuel cell stack and a detachable partition device is arranged between power generation portions other than the voltage detection portion so that the voltage detection portion can be exchanged.

In the fuel cell stack, the voltage detection portion and the power generation portion other than the voltage detection portion are easily detachable. Because the power generation portion and the voltage detection portion are independently stacked, one voltage detection portion can be used in combination with various power generation portions. Because the structure of the voltage detection portion is closely associated with a subsequent abnormality processing, the subsequent diagnosis need not be changed greatly when the same detection portion is used.

(9) The invention provides a fuel cell system for diagnosing the existence/absence of abnormality of a fuel cell stack or a system by using at least one set of cell stack portions constituting a part of the fuel cell stack as a detection portion, wherein at least one cell of the detection portion is equipped with a membrane/electrode assembly (MEA) having a smaller electrode area than cells of power generation portions other than the detection portion.

(10) The invention provides a fuel cell system for diagnosing the existence/absence of abnormality of a fuel cell stack or a system by using at least one set of cell stack portions constituting a part of the fuel cell stack as a detection portion, wherein at least one cell of the detection portion is constituted in such a fashion that a part of gas flow path constituting a part of gas flow path arranged in a separator constituting the cell does not come into contact with a catalyst electrode constituting the cell.

The operation of a cell having a small electrode area or electrode effective area is relatively a high current density operation and the cell is therefore always under a severer condition than other power generation portions. In the embodiments of (9) and (10), abnormality is allowed to occur more quickly in the detection portion than in the power generation portion and the occurrence of abnormality can be detected in an earlier stage than in the cells of the power generation portions.

(11) The invention provides a fuel cell system for diagnosing the existence/absence of abnormality of a fuel cell stack or a system by using at least one set of cell stack portions constituting a part of the fuel cell stack as a detection portion, wherein at least one cell of the detection portion is constituted in such a fashion that at least a part of gas flow path in a separator associated with at least one of anode and cathode electrodes of the cell has a smaller sectional area than the cells of the power generation portions other than the detection portion.

Clogging of water in the flow path is relatively more likely to occur in the cell in which a part of the flow path section is small. Therefore, gas insufficiency is likely to occur and this cell is always under a severer operating condition than other power generation portions. Because abnormality is allowed to occur more quickly in the detection portion than in the power generation portion, the occurrence of abnormality can be detected in an earlier stage than in the cells of the power generation portions.

(12) The invention provides a fuel cell system for diagnosing the existence/absence of the fuel cell stack or a system by using at least one set of cell stack portions constituting a part of a fuel cell stack as a detection portion, the fuel cell having anode and cathode electrodes to which a catalyst is adhered, wherein at least one cell of the detection portion has a smaller catalyst amount of at least one of the anode and cathode electrodes of at least one cell than cells of power generation portions other than the detection portion.

Since the cell having a small amount of the electrode catalyst provides the reaction with its small catalyst amount, the drop of the voltage is quick and the cell is always under the severer operating condition than the rest of the power generation portions. Because abnormality is more likely to occur in the detection portion than in the power generation portion, the occurrence of abnormality can be detected in an earlier stage than in the cells of the power generation portion.

(13) The invention provides a fuel cell system for diagnosing the existence/absence of a fuel cell stack or a system by using at least one set of cell stack portions constituting a part of the fuel cell stack as a detection portion, the fuel cell having an anode electrode to which ruthenium is adhered, wherein at least one cell of the detection portion has a smaller ruthenium amount of the catalyst electrode portion of the anode electrode than cells of power generation portions other than the detection portion.

The cell having a smaller ruthenium amount of the anode electrode catalyst is likely to undergo poisoning of carbon monoxide (CO) and is always under a severer operating condition than other power generation portions. Since abnormality is allowed to occur in the detection portion in an earlier stage than in the power generation portions, the occurrence of abnormality can be detected in an earlier stage than in the cells of the power generation portions.

(14) The fuel cell power generation system of any of (9) to (13) is equipped with a diagnosis portion for extracting a frequency component of a predetermined frequency range from the voltage detected by the detection portion and diagnosing the existence/absence of a fuel cell stack or a system containing the fuel cell stack on the basis of the frequency component.

An unstable phenomenon of the voltage of the voltage detection portion occurring in an earlier stage than in the cells of the power generation portions is detected with high accuracy by extracting the characteristic frequency component. The cause of abnormality can be easily stipulated by separating the signal for each frequency range and executing a diagnosis processing.

(15) The fuel cell power generation system of any of (9) to (13) is equipped with a diagnosis portion for diagnosing the existence/absence of a fuel cell stack or a system containing the fuel cell stack on the basis of the temperature detected from at least a part of the detection portion.

Abnormality that occurs in an earlier stage than in the cells of the power generation portions is detected through the temperature change. In this case, detection of abnormality can be made by using the temperature alone but the abnormality diagnosis becomes more reliable when the detection by the temperature is combined with the abnormality detection by the voltage.

(16) In the fuel cell power generation system of any of (9) to (13), the detection portion is provided to at least one of the end portions of the fuel cell stack and a detachable device is arranged between power generation portions other than the detection portion so that the detection portion can be exchanged.

Because the cell of the detection portion is allowed to exhibit abnormality in an earlier stage than the cells of other power generation portions, cell degradation of the detection portion is generally earlier in some cases. Therefore, only the detection portion can be exchanged independently while the cells of the power generation portions are left as such.

(17) The invention provides a fuel cell power generation system having a diagnosis portion for diagnosing a fuel cell stack or a system, wherein the system includes a control portion for changing by a predetermined amount a current value taken out from the fuel cell stack when abnormality of the fuel cell stack or the system is detected by the diagnosis. When abnormality of the fuel cell stack or the system is detected by the diagnosis, for example, the control portion reduces the current taken out from the fuel cell stack by the predetermined amount. The predetermined amount for controlling the current is determined on the basis of the cause of abnormality extracted by the diagnosis portion. When abnormality of the fuel cell stack or the system is detected by the diagnosis, a first control step for changing the current taken out from the fuel cell stack by the predetermined amount is executed and then a second control step for avoiding abnormality is executed on the basis of the cause of abnormality detected by the diagnosis.

When control for changing the amount of the current taken out from the fuel cell stack by the predetermined amount is executed with the occurrence of abnormality, a burden that may result in deterioration of the cell stack is quickly mitigated and the system operation can be continued stably.

(18) The invention provides a fuel cell system including fuel cell stacks, wherein the system includes a voltage detection portion for detecting a voltage by using at least a part of the fuel cell stacks as a detection portion, and a diagnosis portion for extracting a frequency component of at least one predetermined frequency range from the voltage detected by the voltage detection portion and diagnosing the existence/absence of abnormality of the fuel cell stack or a system containing the fuel cell stack on the basis of the frequency component.

In a compact fuel cell stack having a small number of stacks, the abnormality diagnosis in the frequency range can be executed in some times even when the voltage detection portion is not limited to a smaller stack portion of the fuel cell stack. When such a compact fuel cell stack is assumed, the abnormality diagnosis in the frequency range becomes possible from the voltage output of the entire cell stacks without always stipulating the detection portion.

The fuel cell power generation system according to the invention is suitable for a fuel cell power generation system for home use.

Embodiment 1

FIG. 1 is a schematic view showing in an extracted form a fuel cell stack and a voltage detection portion for diagnosis according to Embodiment 1 of the invention.

First, reference numerals in the drawing will be explained. Reference numeral 100 denotes a fuel cell stack. Reference numeral 1 denotes a voltage detection portion for detecting a voltage Vd for diagnosis. Reference numerals 2a and 2b denote terminals for voltage detection, that is, voltage detection terminals. Reference numerals 3a and 3b denote output terminals for outputting a stack output voltage Vout. Reference numeral 4 denotes a D.C. component detection line for detecting a D.C. component of the voltage Vd for diagnosis. Reference numerals 5a and 5b denote A.C. component detection lines for detecting a predetermined specific frequency component from the voltage Vd for diagnosis. Reference numerals 6a and 6b denote circuits (band pass filters, for example) for extracting specific frequency components. Reference numerals 7a and 7b denote amplification circuits (A.C. amplifiers, for example) for amplifying the extracted small frequency components. Reference numeral 8 denotes a signal processing portion (processor using a microcomputer, for example) for diagnosing abnormality.

The circuits 6a and 6b for detecting the specific frequency components may use high-pass filters or low-pass filters and other signal filtering means besides the band pass filters. More concretely, the circuits 6a and 6b may be constituted by electric circuits having electrical characteristics that significantly pass only the signals of the frequency range to be extracted. Each frequency component may be extracted and amplified by executing high speed Fourier transform or other frequency analyses by use of a microcomputer.

The voltage Vd for diagnosis may be subjected to differentiation so that the frequency components other than the D.C. component can be detected from the stage at which they are yet small. The corresponding frequency components may be again extracted after this differentiation processing.

The circuits 6a and 6b for detecting the specific frequency components may be constituted into a dedicated compact integrated circuit together with the amplification circuits 7a and 7b or with the signal processing portion 8.

Next, the function of each portion will be explained. In FIG. 1, one set of cell stack portions forming a part of the fuel cell stack 100 operate as the voltage detection portion 1. An output voltage of the fuel cell stack 100 is taken out from the output terminals 3a and 3b and the voltage Vd for diagnosis, from the voltage detection terminals 2a and 2b. Here, the output terminal 3a may be the same as the voltage detection terminal 2a.

Since the voltage detection portion 1 for diagnosis is limited to the part of the fuel cell stack 100, the structure necessary for taking out the voltage Vd for diagnosis and for wiring can be much more simplified in comparison with the case where the entire fuel cell stack is divided into a plurality of cell groups and the voltage detection portion is provided to each group. In addition, the number of allocation of I/O ports of a control unit can be decreased. On the other hand, when any abnormality occurs in cells other than those of the voltage detection portion 1, this abnormality cannot be detected directly. To avoid this problem, the invention employs the following measures.

The first method sets the voltage detection portion 1 at a position at which abnormality occurs more quickly than in other stack portions. Abnormality is likely to occur in the cell or cell group at the end portion in the fuel cell stack. This is partly because the end portion is more susceptible to the change of the ambient temperature than the inside of the cell stack. When the cell group in which abnormality is more likely to occur is used as the voltage detection portion, the occurrence of abnormality can be caught more quickly than the occurrence of abnormality in other cell stacks. Therefore, it is not necessary to monitor the stack cell voltages other than that of the voltage detection portion but the processing for avoiding abnormality can be quickly executed.

Needles to say, the position of the cell at which abnormality is likely to occur varies depending on the cell stacks. Therefore, when the voltage terminals are provided in advance to all the cells and the cell positions at which abnormality is likely to occur under several assumed operating conditions are assumed, the abnormality diagnosis in the actual operation can be executed similarly by using at least one set of cell stacks forming the part of the fuel cell stack.

Figure 2:
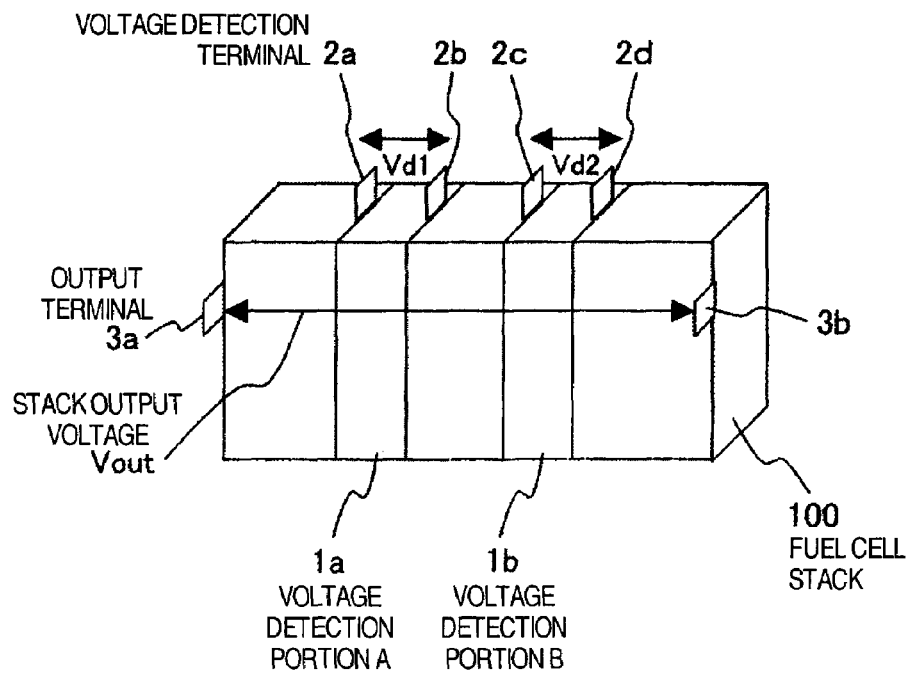
FIG. 2 is an explanatory view when the voltage detection portions are arranged at two intermediate positions inside the fuel cell stack.

FIG. 2 explains the case where the voltage detection portions are arranged at two positions at intermediate portions of the fuel cell stack. The voltage detection portions 1a and 1b are voltage detection portions A and B for detecting the voltages Vd1 and Vd2 for diagnosis, respectively. Reference numerals 2a, 2b, 2c and 2d denote voltage detection terminals.

It is hereby assumed that abnormality is likely to occur at the positions of the voltage detection portions A and B in the fuel cell stack of this embodiment. In other words, a small eddy is likely to occur at two positions inside a manifold at the depth from an inlet of the stack at a gas flow rate corresponding to the rated operation condition of the stack and the voltages of the cells corresponding to these positions are likely to relatively fluctuate or to get into burst, for example. When the burst of voltage exclusively occurs at either one of the voltage detection portions A and B (when the burst occurs at one of them, it does not occur at the other) depending on the flowing condition of the gas, both voltage detection portions A and B may be used as the voltage detection portions and when the burst occurs simultaneously at both of them, either one of them may be used as the voltage detection portion.

Next, the second method extracts a signal component of a predetermined specific frequency range and executes abnormality diagnosis on the basis of the signal component extracted. The fuel cell stack, if normal, outputs a voltage that is substantially constant under the operating condition but under the undesirable operating condition, the voltage changes with time. When the voltage is expanded to the frequency range at this time, the components of a specific frequency range are great in many cases. A significant correlation with the occurrence of abnormality can be acquired in a certain frequency range though variance of measurement is great in some cases. In the embodiment shown in FIG. 1, such a frequency range is extracted by using means such as a band pass filter, is amplified and is then used for the abnormality diagnosis processing. It is of course possible to extract and process the signal component of the corresponding frequency range by other means.

When a certain specific frequency component having the significant correlation with the occurrence of abnormality is extracted, other frequency components not having the correlation are removed and the S/N ratio of the signal can be improved. Detection accuracy can be improved, too, because the occurrence of the small frequency component is amplified and caught by the amplification circuit 7. When the fuel cell stack is taken into consideration as a whole, it is seldom that abnormality does not at all occur in only specific cell or cells though abnormality is more likely to occur in the specific cell stack portion or portions. For, the fuel is supplied to each cell through the manifold in the fuel cell stack and the current is taken out in series. For these reasons, the occurrence of abnormality affects other cells though the degree of influences is different. Abnormality diagnosis can be correctly made even when the voltage detection portion is limited to the part of the fuel cell stack as long as detection accuracy is such that the occurrence of abnormality can be caught in its very early stage.

In this embodiment, the frequency component having the significant correlation with the occurrence of abnormality is extracted and detected while it is yet small. Therefore, detection accuracy can be improved, the stack cell voltage of other cells need not be monitored and the processing for avoiding abnormality can be quickly executed.

Here, the number of cells contained in the voltage detection portion can be arbitrarily set by adjusting the position of the voltage detection portion 1 but is preferably 20 cells or below and particularly preferably 10 cells or below from the aspect of the practical operation. When a large number of cells are contained in the voltage detection portion, voltage variance (oscillation component) of each cell is averaged among the cells and correct abnormality detection in the frequency range becomes difficult. When the number of cells is about 10, voltage variance (oscillation component) of each cell is not averaged so easily. The degree of averaging proceeds when the number of cells is about 20 but the number remains within the range that does not spoil the characteristics. When the number of cells of the voltage detection portions is too small, on the contrary, only a part of the cell voltage is the detection voltage and the diagnosis of the entire stack cannot be made correctly from time to time. In those stacks which have stable characteristics, the existence/absence of abnormality can be judged by detecting the cell voltage of only an extreme part at the end portion. Therefore, about 10 to 20 cells may be selected as the practical and typical number of cells. The number of cells of the voltage detection portion 1 is not always limited to the range described above depending on the characteristics of the fuel cell stack as the object or the amplification method of the very small signal and the abnormality diagnosis can be executed by taking the signal components of the specific frequency range into account.

The abnormality analysis in the frequency range can be executed in some cases without always limiting the voltage detection portion 1 to the cell stack portions constituting the fuel cell stack in a compact fuel cell stack having a relatively small number of stacks. In such a compact fuel cell stack, the abnormality analysis in the frequency range may be carried out from the voltage output of the entire cell stack without specifically limiting the voltage detection portion to the portion of such a fuel cell stack.

To detect the voltage Vd for diagnosis, it is preferred to keep the current taken out from the fuel cell stack under a controlled condition at a constant value. For, the change of the current invites the change of the voltage Vd for diagnosis owing to the original characteristics of the fuel cell stacks irrespective of the existence/absence of abnormality. In the system operation, a predetermined current value is set for a predetermined operating condition (operation mode) such as a rated operation or a partial load operation and is controlled by a power controller. A current control condition that is substantially constant can be acquired in this way during the system operation. The diagnosis may be executed under this condition.

To avoid the error of the diagnosis, the diagnostic processing by the signal processing portion 8 may be temporarily suspended at the start or stop or at the time of the change of each operation mode (rated operation or each partial load operation). Since the control portion for controlling the system as a whole can determine in which operation condition the system is, it is possible to reject the data corresponding to a transient response period as the object of the diagnosis from the sampled data by referring to information relating to set or switch of the operating condition.

The signal processing portion 8 for the diagnosis may be constituted into a unit integral with the control portion for controlling the system as a whole or may be constituted in a separate unit so that information can be mutually exchanged.

Referring to FIG. 1, two band filters, that is, BPF1 and BPF2, extract the signal components of at least two frequency ranges. At least the following two effects can be acquired when the signal processing is executed by using the signals of these two frequency ranges as in this embodiment.

The first effect is that abnormality can be detected with high accuracy and the cause of the occurrence of this abnormality can be stipulated by the difference of the frequency ranges by separating the signals of these frequency ranges through BPF 1 and 2 when the change of the frequency components occurring due to different causes of abnormality appears as the signal change of the different frequency ranges.

When the change of the frequency components resulting from the occurrence of one abnormality simultaneously appears as the signal changes of the different frequency ranges, another effect is that abnormality can be judged as occurring only when the signal changes occur in both frequency ranges by checking the correlation between them. Therefore, even when the noise component overlaps with the signal components of the frequency ranges, the abnormality diagnosis can be conducted correctly. When the noise overlaps with one frequency component among the signal components of the frequency ranges, for example, it is difficult to discriminate whether this results from the occurrence of abnormality or from the noise by the method that detects only the frequency components. However, when the signal component of another frequency range is confirmed and when this signal component increases with the correlation, it is possible to judge the cause as the occurrence of abnormality and when not, as the noise.

The frequency to be detected practically may of course be only the signal component of one frequency range. In this case, the construction of the signal processing system for the diagnosis can be simplified.

The possibility of the occurrence of abnormality in the frequency component varies depending on the fuel cell stack. However, when the frequency range in which abnormality is likely to occur under several conditions assumed beforehand is stipulated, the abnormality diagnosis in the frequency ranges can be executed and the cause of abnormality can be caught separately in each frequency range.

A method of setting a typical frequency as the detection object will be explained with reference to FIG. 3. Reference numeral 200 denotes a reformer for supplying a reformed gas to the fuel cell stack 100. Reference numeral 300 denotes a reformer control portion for controlling the reformer. Reference numeral 301 schematically represents an example of the control signal transmitted for controlling the reformer 200. The control signal 301 assumes the case where discrete set values are switched and controlled so that the flow rate of the raw material fuel to be supplied to the reformer reaches a predetermined flow rate, for example.

To diagnose the existence/absence of abnormality by extracting a signal component of a specific frequency range from the voltage Vd for diagnosis, it is first advisable to pay a specific attention to the frequency inherent to the control signal 301. In FIG. 3, a typical frequency that is the inverse number of the signal periodicity is set to f1. The periodicity of the control signal 301 assumes the case where it occurs owing to normal control, the case where it occurs as a result of control under the abnormal condition of the reformer and the case where periodicity is intentionally added for only a predetermined time.

When the periodicity having its center at the frequency f1 occurs by the normal control, this periodicity affects the voltage Vd for diagnosis in the fuel cell stack. Here, if the condition is normal, the frequency components are averaged in the reaction process inside the reformer and the influences appearing on the voltage Vd for analysis are relatively small. When any abnormality occurs in the reformer, on the other hand, the voltage signal component having its center at the frequency f1 becomes great in some cases. When the flow rate control having the frequency f1 is applied to the reformer portion temperature control of the reformer, for example, oscillation of the frequency f1 appears in the gas composition and the flow rate of the reformed gas but in the normal operation, the periodicity of the gas composition or the flow rate is rendered uniform while it passes through the shift reaction portion of the CO oxidation removal portion. When any abnormality such as non-uniform reaction occurs in the reaction inside the shift reaction portion or the CO oxidation removal portion, on the other hand, a part of the reaction gas sometimes slips and outflows from these reaction portions due to channeling and the like. In such a case, the periodicity appearing in the gas composition and in the flow rate is not rendered uniform but is supplied as such to the fuel cell stack, so that the voltage signal of the frequency range containing this frequency component increases. When this voltage is detected, abnormality of the reformer can be separated and detected.

The case where the reformer is under the abnormal condition and the periodicity described above appears as a result of the control for correcting this abnormal condition is concretely the following case. A constant control signal for causing the gas to flow at a constant flow rate is transmitted during the normal operation. When any abnormality (temperature rise, for example) occurs at this time for some reason or other, the flow rate value is changed so as to suppress the occurrence of this abnormal condition and the abnormal condition (high temperature condition) is corrected to the normal condition (normal temperature). The flow rate value returns to the original set value with this recovery. However, abnormality (temperature rise, for example) again develops unless the original cause of the occurrence of abnormality is eliminated. The periodicity occurs as this loop is repeated. When the cause is not improper tuning of feedback control, the periodicity appears as hunting. When the frequency corresponding to these types of periodicities is symbolically expressed as f1, the signal components in the frequency range having its center at f1 hardly exist. Because the signal components appear with the occurrence of abnormality, however, the existence/absence of abnormality can be diagnosed from the existence/absence of the frequency components extracted with f1 as the center.

When abnormality is judged as existing as a result of this diagnosis, there is the possibility that this abnormality may result from improper control parameters due to the change of the reformer with time when the tuning defect of the control is the cause. In this case, recovery can be made in some cases by automatic change of the control parameters.

The case where the periodicity is intentionally applied to the control signal for a predetermined time is concretely the following case. In the normal operation, a constant control signal for causing the gas to flow at a constant flow rate is transmitted. Oscillation having its center at the frequency f1 is applied to this constant control signal for a predetermined time in order to check whether or not the frequency component corresponding to this oscillation appears in the frequency component having its center at f1 of the voltage Vd for diagnosis as planned. In this case, the operation is normal when the frequency component appears and can be judged as abnormal when the frequency component does not appear for some reason or other. The operation condition is judged as normal when the frequency component is as large as planned, and as abnormal when the frequency component exhibits a different large value. Since the specific frequency component is intentionally added in advance in this embodiment, the frequency range for the abnormality diagnosis can be reliably selected.

When the existence/absence of abnormality is diagnosed by extracting the signal component of the specific frequency range from the voltage Vd for diagnosis, it is also advisable to pay specific attention to a peculiar frequency that the gas composition or the flow rate of the reformer exhibits under the interlocking state with the system. In FIG. 3, this frequency associated with the reformer condition is set to f2. When hydrogen supplied from the reformer is not fully consumed by the fuel cell stack but remains in the fuel cell system, remaining hydrogen is returned to and burnt by the burner of the reformer and is recovered in most cases as heat associated with the reaction of the reformer. In such a case, a closed loop is formed through heat. When a transitory temperature abnormality occurs in the reformer, for example, the change resulting from this abnormality propagates through the closed loop and sometimes affects again the temperature of the reformer. Owing to the propagation of the influences by the closed loop, this temperature abnormality comes to possess a false periodicity and when this temperature abnormality affects the reformed gas composition, the signal component of this frequency range appears in the voltage Vd for diagnosis that is detected at the voltage detection terminals. The existence/absence can be diagnosed by extracting this signal component. The periodicity resulting from the closed loop has a false periodicity with a time interval in which the gas moves inside the system, for example. Needless to say, the existence/absence of abnormality can be detected in some cases with the false periodicity depending on the construction peculiar to the reformer or on the control method.

When the existence/absence of abnormality is diagnosed by extracting the signal component of the specific frequency range from the voltage Vd for diagnosis, it is advisable to pay specific attention to the peculiar frequency to the fuel cell stack operation. In FIG. 3, this frequency relating to the fuel cell stack operation is set to f3. Abnormality associated with this frequency includes stay of water in the fuel cell stack, for example. When any problem occurs in the dew point management of the fuel cell stack, water is condensed and stays inside the fuel cell stack. Staying water is discharged from the cell stack within a time of several to dozens of minutes, for example, depending on the construction of the cell stack. When condensation of water continuously occurs, clogging of water and its discharge appear with a false periodicity. The existence/absence of abnormality can be diagnosed by extracting the signal component of the frequency range resulting from this periodicity. Abnormality of the gas flow in the fuel cell stack is another abnormality. When an eddy is created by the gas flow inside the manifold of the fuel cell stack, the occurrence frequency of the eddy sometimes has a false periodicity. The existence/absence of abnormality can be diagnosed by extracting the signal component of the frequency range resulting from this periodicity. The center frequency of the periodicity mostly varies depending on the cause. Therefore, the cause of abnormality can be diagnosed with the existence/absence of abnormality when the voltage signal component of the frequency range resulting from these periodicities is independently extracted.

The explanation given above is mainly directed to the abnormality diagnosis resulting from the reformer and the fuel cell stack. Abnormality associated with the cooling water system and the power conditioner can be similarly diagnosed by paying specific attention to the periodicity inherent to such abnormality. The periodicity associated with the cooling water system is determined in many cases by the flow characteristics and the thermal characteristics and consequently appears as a relatively elongated periodicity. Abnormality associated with the power conditioner is determined in many cases by the electrical characteristics and consequently appears as a relatively short periodicity.

Besides the diagnosis described above, the D.C. components of the stack output voltage Vout and the voltage Vd for diagnosis, that is, components other than the component associated with oscillation, may be used in combination. In this case, the magnitude of the voltage value, for example, may be used as one of the judgment conditions of abnormality. The appearance of a specific frequency component in the voltage and a gentle change (drift) of Vout and Vd may be converted to the AND condition and may be used for the abnormality diagnosis.

When the abnormality diagnosis is executed on the basis of both characteristic change appearing in the specific frequency component and characteristic change appearing in the D.C. component, accuracy of the diagnosis can be improved, and the cause can be stipulated in further detail and more easily.

The values of Vout and Vd gradually drop with time even in the normal fuel cell stack. Therefore, when the threshold value of the abnormality diagnosis is called out by map on the basis of the voltage values, the change of the threshold value with time can be appropriately corrected and the abnormality diagnosis inclusive of the change with time can be executed.

Figure 3:
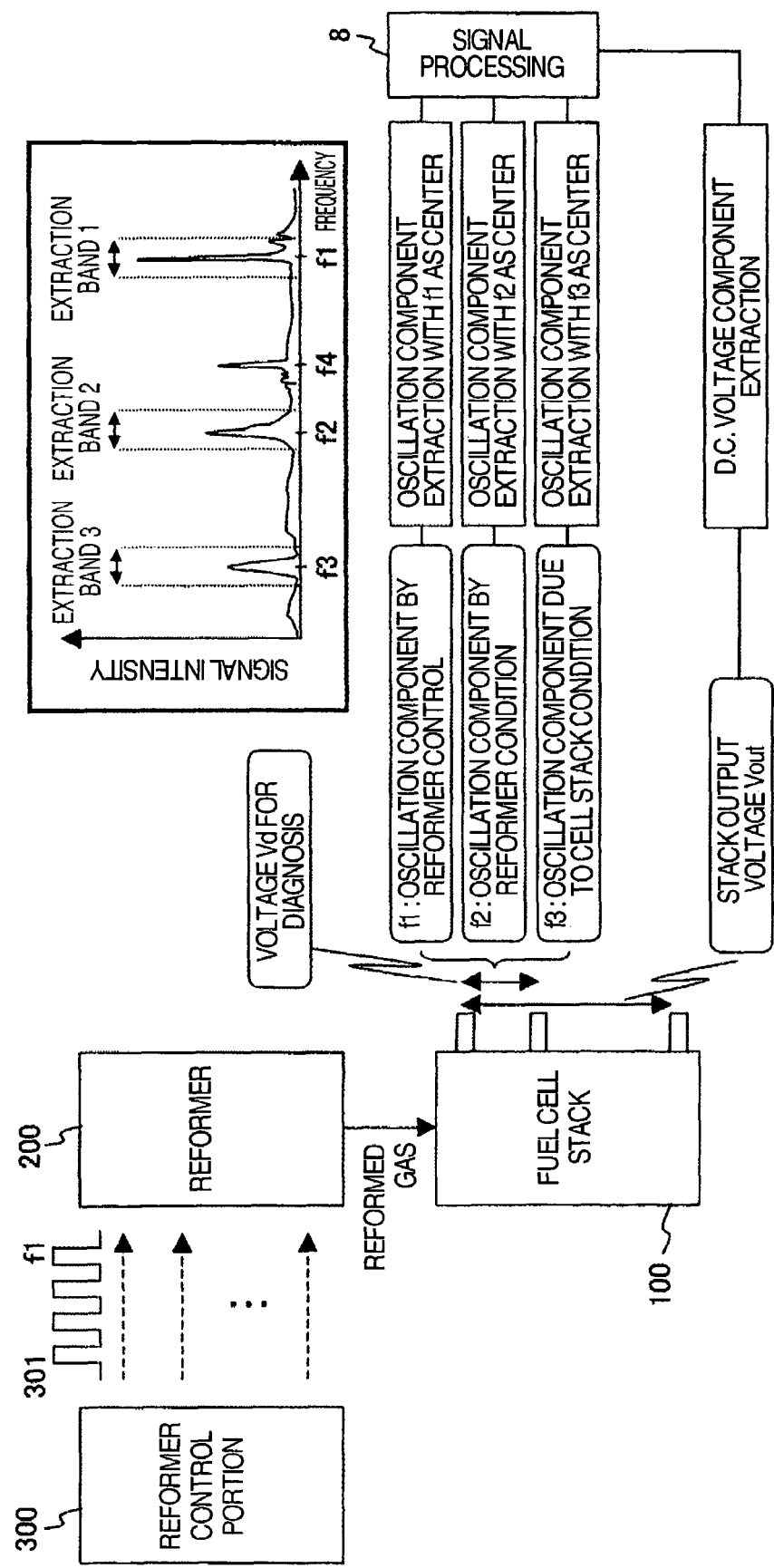
FIG. 3 is an explanatory view showing an example of a typical method of setting a frequency for a detection object.

FIG. 3 shows only one control signal to clarify the explanation but other control signals can be handled in the same way. Information of these signals may be used in combination for the diagnosis in the signal processing for the diagnosis.

FIG. 3 schematically shows the mode of extraction of a specific frequency component inside a square frame. The abscissa represents the frequency and the ordinate does the signal intensity. Here, the term "signal intensity" means a value obtained by squaring the amplitude of the signal oscillation component corresponding to each frequency or calculating its root. The signal intensity can be normalized by the D.C. component, etc and can be displayed in the form from which this D.C. component is removed, but may be displayed by other forms. Each extraction band shown in the drawing is disposed for the purpose of diagnosis and the frequency bands each having a predetermined width are set in advance with f1, f2 and f3 to be noted being the center, respectively. The signal processing portion 8 calculates the intensity of the frequency component contained in each of the extraction bands 1, 2, 3 and determines the intensity of the voltage signal of each frequency band.

Consequently, it becomes possible to determine whether or not the component of each extraction band exists or what value the component has. The existence/absence of abnormality can thus be diagnosed on the basis of the calculation result of the signal intensity. The frequencies f1, f2 and f3 hereby represent the frequencies for explaining the signal processing flow shown in the drawing, respectively, by way of example. A peak can be observed at a frequency f4 in the drawing in addition to the frequency. When it is known beforehand that the peak appearing in this frequency range is the noise unique to the system as a result of experimental confirmation made in advance, however, such a noise can be reliably removed from the signal used for the abnormal diagnosis by limiting the width of the extraction band and accuracy necessary for the diagnosis can be improved.

Figure 4:
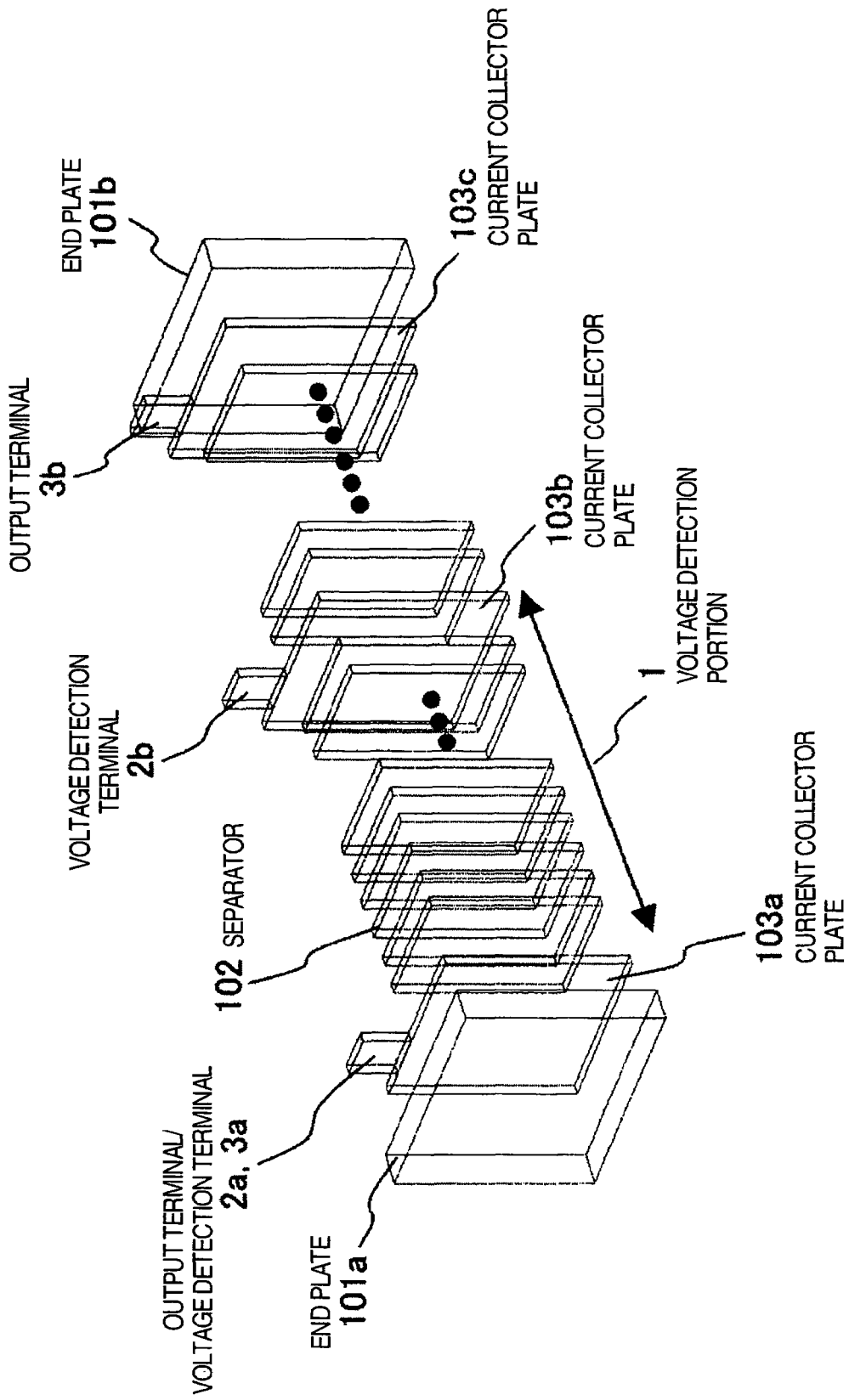
FIG. 4 is a frame view useful for explaining a concrete structural example of the voltage detection portion.

FIG. 4 is a frame view for explaining a concrete structural example of the voltage detection portion 1. Reference numerals 101a and 101b denote end plates for keeping the fuel cell stacks under a predetermined fastening condition. Reference numeral 102 denotes a separator. Reference numerals 103a, 103b and 103c denote current collector plates. Here, the voltage detection terminal 2a of the fuel cell stack operates also as the output terminal 3a. Those members that are not directly associated with the explanation such as electrolyte films, diffusion layers, sealants, cooling means, etc, are omitted from the drawing.

The voltage detection portion 1 is constituted into the cell stack member between the current collector plate 103a and the current collector (intermediate plate for voltage detection) 103b. As to the difference from the original fuel cell stack structure, the voltage detection portion according to the invention can be constituted by a small change, that is, the insertion of the current collector plate 103b as the voltage detection intermediate plate. Since the current collector plate as the voltage detection intermediate plate is used, the occurrence of connection defects of wiring with the passage of time can be lowered and voltage detection can be made more reliably.

Figure 5:
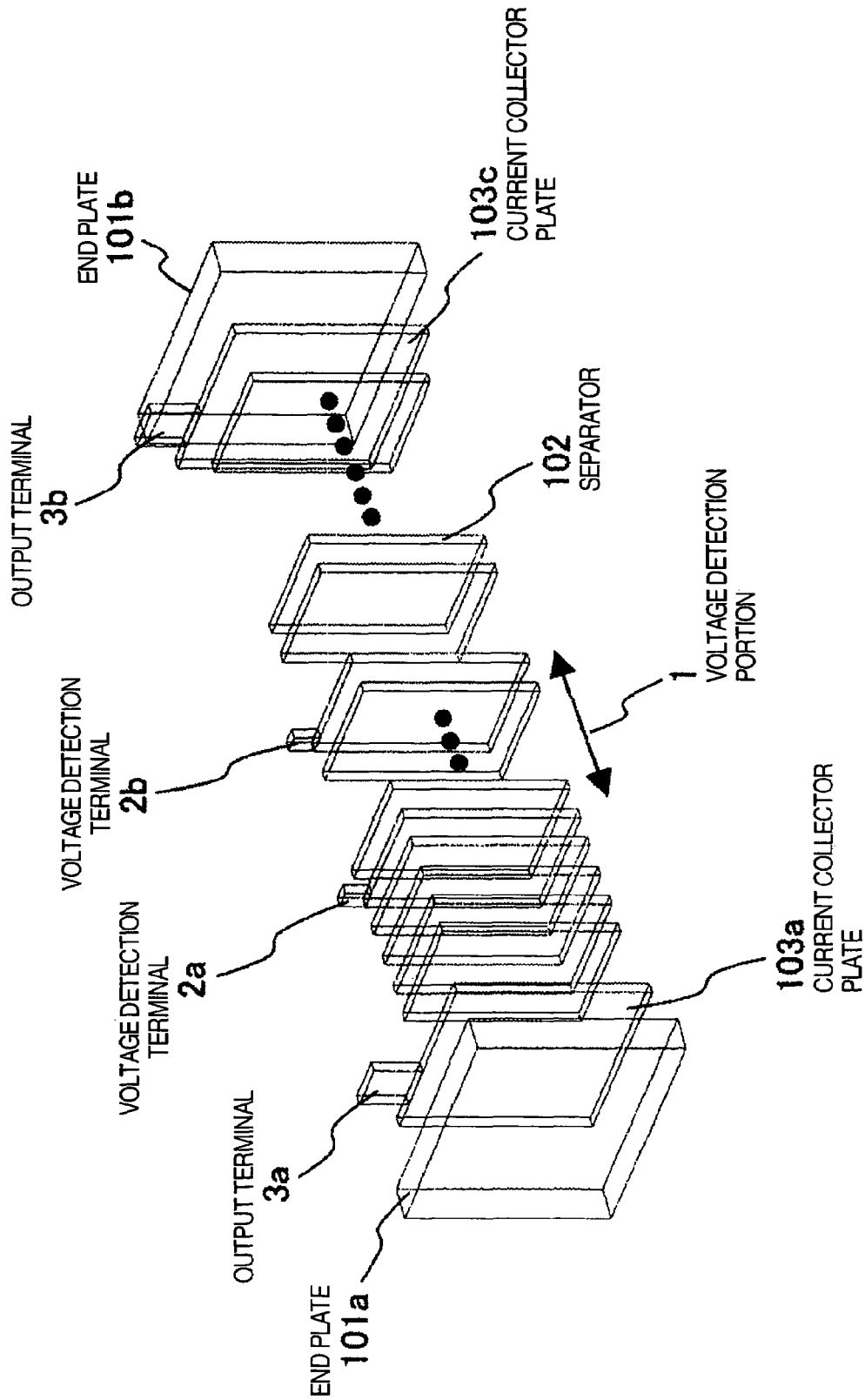
FIG. 5 is another frame view useful for explaining a concrete structural example of the voltage detection portion.

FIG. 5 is another frame view for explaining a concrete structural example of the voltage detection portion 1. Here, the voltage detection portion 1 is constituted into a cell stack body between the voltage detection means 2a and 2b without using the current collector plate 103b. The voltage detection terminals 2a and 2b are integrally arranged at the ends of the ordinary separator without using the specific current collector plate.

The following method is available as the integration method. When the separator is a separator formed by molding or a metal type separator, terminals for the voltage detection are preferably molded integrally and in advance at the positions of the separator as shown in the drawing. Holes for electric wiring and a structure suitable for the electric wiring are preferably disposed at the voltage detection terminals. When the separator is of a compact graphite type the shape of which cannot be changed relatively easily, a hole may be formed in the separator so that the voltage detection terminal can be buried. As to the difference from the construction of the original fuel cell stack, the difference is mainly provision of the unitary voltage detection terminals 2a and 2b to the predetermined separator. In comparison with the case where the current collector plates are added, therefore, the size of the cell stack itself in the stacking direction does not increase. Because the voltage detection terminals 2a and 2b can be integrated beforehand with the predetermined separator, the stacking sequence of the fuel cell stack need not be changed.

Figure 6:
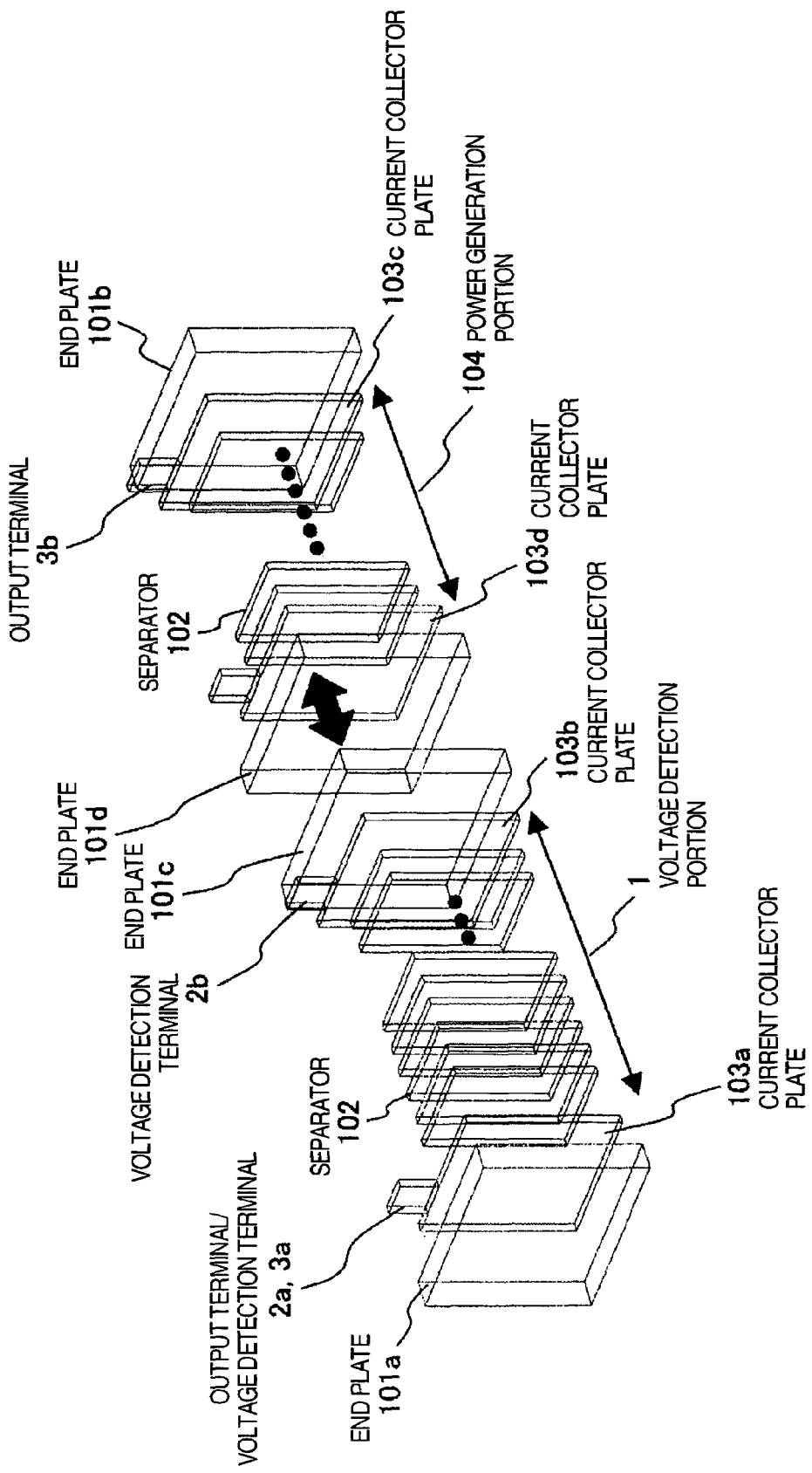
FIG. 6 is still another frame view useful for explaining a concrete structural example of the voltage detection portion.

FIG. 6 is another frame view for explaining a concrete structural example of the voltage detection portion 1. Here, end plates 101c and 101d are interposed between the voltage detection portion 1 and other cell stack portion as the power generation portion 104, and the voltage detection portion and other cell stack portion can be fitted and removed at the position indicated by an arrow in the drawing. In other words, the voltage detection portion 1 is constituted into the cell stack body between the current collector plates 103a and 103b and the power generation portion 104 as the fuel cell stack is constituted as the cell stack body between the current collector plates 103d and 103c in such a fashion that they are adjacent to each other between the end plates 101c and 101d. In this case, the voltage detection portion 1 and the power generation portion 104 can be connected in series by the common manifold in at least the circulation of the flowing gas and cooling water. To this end, a common manifold hole is formed in the end plates 101c and 101d and is brought into coincidence and is closed while keeping air-tightness by seal means such as an O-ring. Alternatively, gas and water are once taken out from the end plate 101c through piping and are again connected to the end plate 101d. The detail of the structures of the end plate and the current collector plate associated with this connection portion can have the same structures as those of the ordinary fuel cell stack. Since the end plates 101c and 101d are electrically isolated from each other, another wiring may be disposed inside and outside the end plat so as to electrically connect the current collector plates 103b and 103d in series or the voltage, etc, may be detected independently.

The independent power generation operation can be made by the voltage detection portion 1 and the power generation portion 104 inclusive of the flowing gas and cooling water circulation but to achieve the correct diagnosis of abnormality, the operating condition of the power generation portion 104 is preferably the same as that of the voltage detection portion 1 as much as possible. In other words, the same application of the voltage and the gas as that of the power generation portion 104 is made to each cell of the voltage detection portion 1 and the cooling water quantity is brought into conformity, too. Since the power generation condition is the same, the abnormality diagnosis becomes easier by monitoring the voltage of the voltage detection portion 1 without the necessity for monitoring the power generation portion 104. According to the construction of the invention shown in FIG. 1, abnormality can be detected accurately and quickly. It is of course possible structurally to apply the different current loads to the voltage detection portion 1 and to the power generation portion 104.

Because the structure of the voltage detection portion is closely associated with the signal processing for the abnormality diagnosis inclusive of setting of the threshold value, it is preferred to keep the structure unchanged for each fuel cell stack to which the structure is applied. When the voltage detection portion 1 and the power generation portion 104 as other cell stack portion have the detachable structure as shown in FIG. 6, one voltage detection portion can be used in combination with various power generation portions by constituting the voltage detection portion 1 with the signal processing portion and fitting it to each cell stack as the object of diagnosis. In consequence, the concrete processing of the abnormality diagnosis need not be adjusted for each fuel cell stack.

Because the removable voltage detection portion 1 is arrange at the end portion of the fuel cell stack, the voltage detection portion is susceptible to the influences of the temperature from outside and can detect the occurrence of abnormality more quickly than other power generation portions 104.

Embodiment 2

Figure 7:
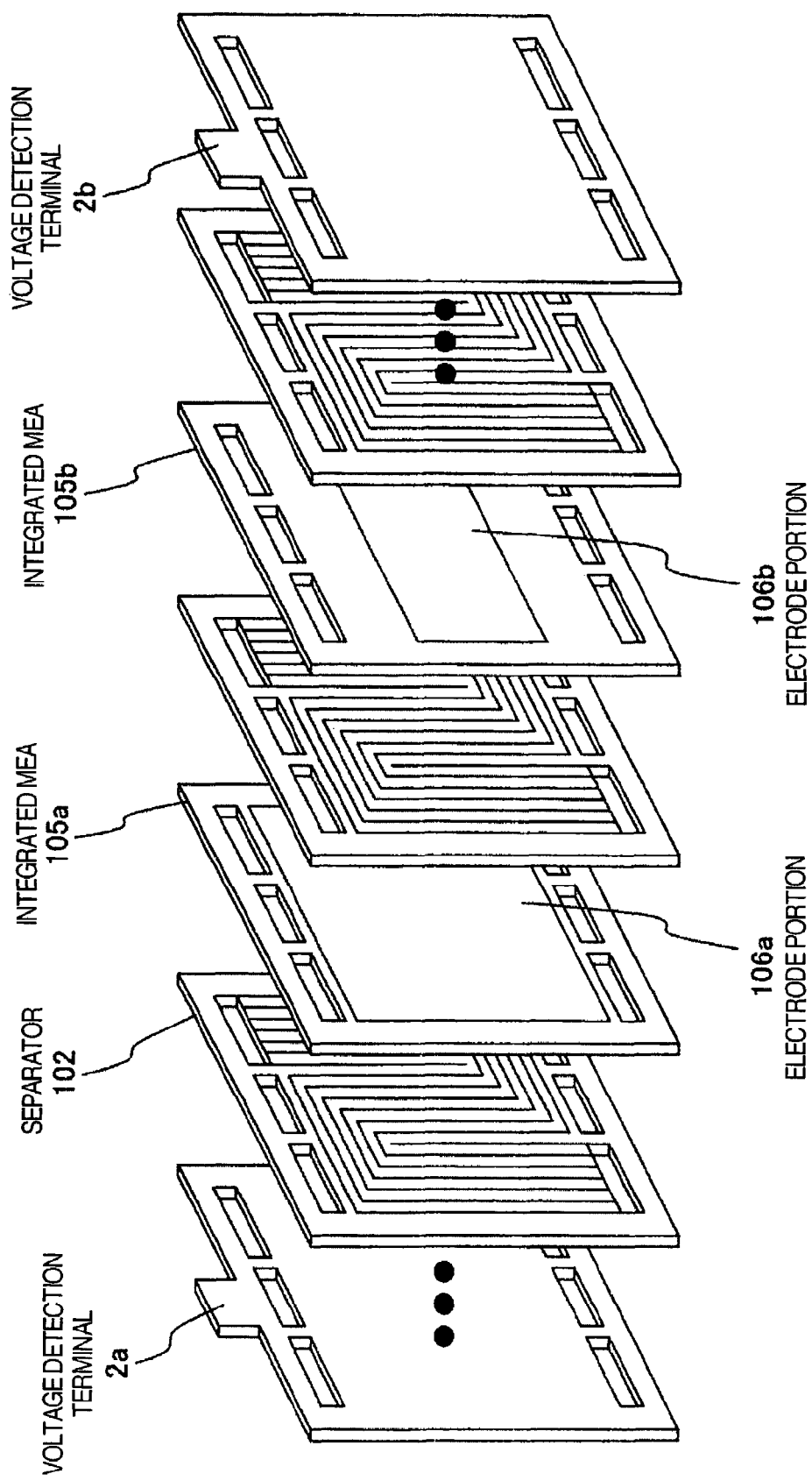
FIG. 7 is a schematic view for explaining a voltage detection portion for diagnosis of a fuel cell stack according to another embodiment of the invention.

FIG. 7 is a schematic view for explaining the diagnosis voltage detection portion of the fuel cell stack. Reference numerals 105a and 105b denote integral MEA (Membrane-Electrode Assemblies). Reference numerals 106a and 106b denote electrode portions each equipped with a catalyst. MEA is obtained by integrating an electrolyte membrane necessary for power generation with an electrode. The integral MEA is obtained by integrating not only the electrode but also a gas diffusion layer, a sealant (gasket), and so forth, that exist in the periphery of MEA. The drawing hereby shows schematically the integral MEA. The number of the separators 102 and the number of the integral MEA are limited to those which are necessary for the explanation and only those necessary are also extracted for other constituent members, too. FIG. 7 shows the case where the integral MEA 105a and the integral 105b are used for ease of illustration but MEA that is not of the integration type and other members may be used in combination.

Figure 8:
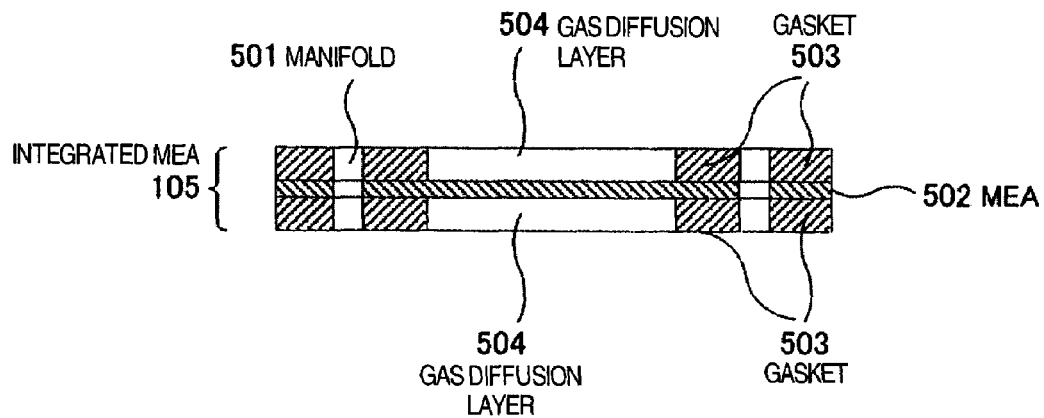
FIG. 8 is a view showing a sectional structural example of an integration type MEA.

FIG. 8 shows the section of a structural example of the integration type MEA 105. Reference numeral 503 denotes a gasket. The gaskets 503 are arranged above and below MEA 502 and can be sealed in such a manner as to encompass the peripheral portion. Reference numeral 504 denotes a gas diffusion layer. The gas diffusion layers 504 are arranged above and below MEA 502 and fit to the portions other then the central portion of the gaskets 503. Reference numeral 501 denotes a manifold. The manifold 501 is a hole bored for the feed of the gas and water. Since this hole is disposed in MEA 502 at the portion of the gasket 503, it is sealed by the gasket and leak of the gas and water can be prevented.

Subsequently, the function of each portion will be explained. The structure in which the cell stack portion is constituted into the voltage detection portion 1 between the voltage detection terminals 2a and 2b is the same as that of Embodiment 1 but abnormal detection accuracy for the diagnosis is improved by applying contrivance to the structure of at least one cell contained in the voltage detection portion 1.

Referring to FIG. 7, at least one cell of the voltage detection portion has a membrane/electrode assembly (MEA) having a smaller electrode area than the cells of the power electrode portion other than this detection portion. More concretely, the area of the electrode portion 106a is equal to that of the power generation portion but the area of the electrode 106b is smaller than the latter. Each flow path of the separator crosses all these areas but the current concentrates on the limited area in the electrode portion 106b in contrast with the electrode portion 106b. The operation having a relatively high current density is made in the cells having a small electrode area or a small electrode effective area and the operating condition becomes always severer than in other power generation portions. Because abnormality is thus more likely to occur in the voltage detection portion than in the power generation portion, the occurrence of abnormality can be detected in an earlier stage than in the cells of the power generation portion. The sensitivity of the voltage detection portion can be improved in this way.

Though FIG. 7 shows a structural example of the voltage detection portion 1, the construction can be regarded as a construction in which cells having smaller electrode areas or smaller electrode effective areas are disposed in the ordinary fuel cell stack when the voltage detection terminals 2a and 2b are used in common as the output terminals 3a and 3b. In this case, the signal processing for the abnormality diagnosis may be executed by using the cells of the electrode portion 106b.

Another construction for improving the sensitivity of the voltage detection portion will be explained with reference to FIG. 9. As to at least one cell of the voltage detection portion, at least a part of the flow paths disposed in the separator of this cell is inhibited from coming into contact with the catalyst electrode related with at least one of the anode and cathode electrodes of this cell. The corresponding electrode structure is schematically shown in the drawing. The flow path structure is shown only symbolically. The difference from FIG. 7 is that when the area of the electrode portion 106b is decreased, it is prevented from coming into contact with a part of the flow paths. As for each flow path, the flow paths other than those paths whose contact with the electrode is limited have in this case the same design as the ordinary power generation cells. Therefore, adverse influences resulting from the structural change hardly occur during the diagnosis. As for all the flow paths inclusive of those paths whose contact with the electrode is limited, the current concentrates on the limited area in the electrode portion 106b in the same way as in FIG. 7. Because the cells having smaller electrode areas and smaller effective electrode areas operate in the relatively high current density operation, the operating condition is always extremely severer than in other power generation portions. Consequently, because abnormality is more likely and more quickly to occur in the voltage detection portion than in the power generation portion, the occurrence of abnormality can be detected in an earlier stage than in the cells of the power generation portions. The sensitivity of the voltage detection portion can be improved in this way.

Figure 9:
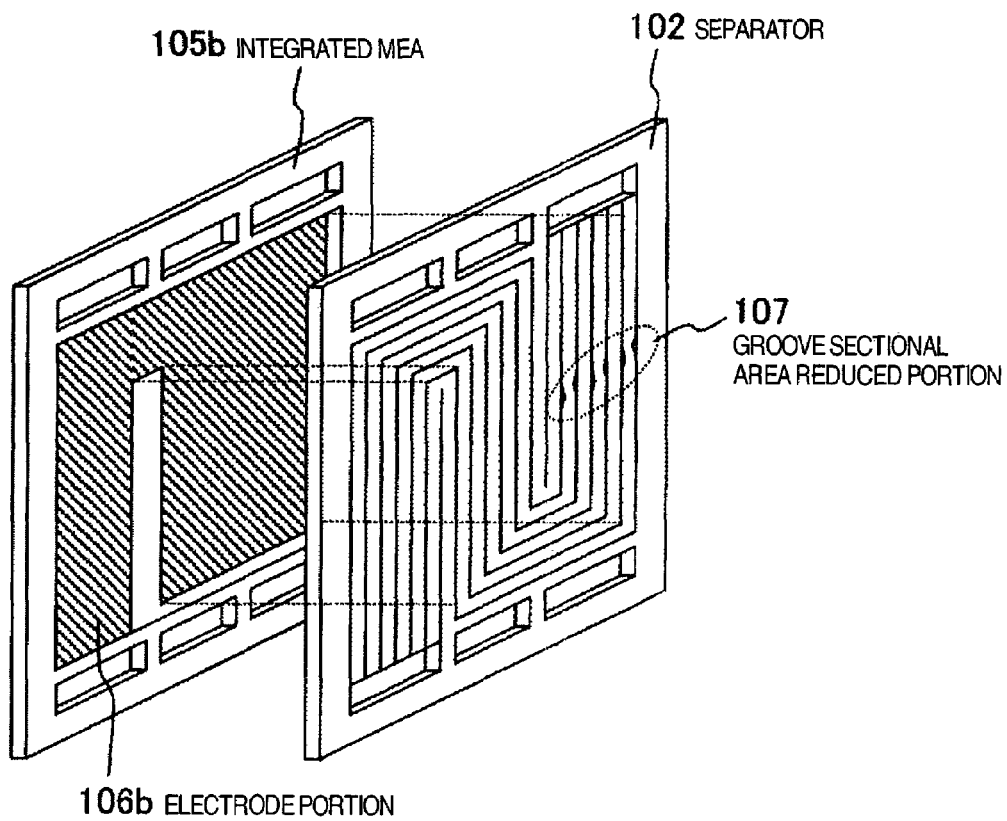
FIG. 9 is a perspective view showing another structural example for improving the sensitivity of the voltage detection portion.

In FIG. 9, a contraction 107, that is, a groove section reduced portion, is disposed at a part of the separator flow path. When the cells having a partially small separator flow path section are arranged, clogging of water of the flow path is likely to occur relatively and gas insufficiency is likely to occur locally. Therefore, the operating condition is always severer than in the rest of the power generation portions. When the construction in which abnormality is allowed to occur more quickly in the voltage detection portion than in the power generation portion is employed in this way, the occurrence of abnormality can be detected in an earlier stage than in the cells of the power generation portion and the sensitivity of the voltage detection portion can thus be improved. Incidentally, only either one of the shape change of the electrode portion 105b and the reduction of the sectional area of the separator flow path represented by the contraction 107 may be executed.

In the construction shown in FIG. 7 or FIG. 9, the similar effect can be acquired by reducing the catalyst amount adhered on the catalyst electrode (at least one of the anode and cathode electrodes) in place of geometrically changing the catalyst electrode area. In other words, the cell having a small amount of the electrode catalyst exhibits an early voltage drop because it involves in the reaction with its small catalyst amount and is always under the severer operating condition than other power generation portions. For these reasons, abnormality is more likely and more quickly to occur in the voltage detection portion than in the power generation portion. In other words, the occurrence of abnormality can be detected in an earlier stage than in the cells of the power generation portions. The sensitivity of the voltage detection portion can thus be improved. The method that decreases the catalyst amount of the voltage detection portion is preferable from the aspect of the cost because it can decreases the amount of the precious metal necessary as the catalyst.

In the construction shown in FIG. 7 or FIG. 9, the similar effect can be acquired by reducing the ruthenium amount adhered on the catalyst electrode portion of the anode electrode, in particular, in place of geometrically changing the catalyst electrode area. In other words, the cell having a small ruthenium amount of the anode electrode catalyst is likely to undergo CO poisoning and is always under the severer operating condition than the rest of the power generation portions. Therefore, abnormality is more likely and more quickly to occur in the power generation portion. In other words, the occurrence of abnormality can be detected in an earlier stage than in the cells of the power generation portion. The sensitivity of the voltage detection portion can thus be improved. The method that decreases the catalyst amount of the voltage detection portion is preferable from the aspect of the cost because it can decreases the amount of the precious metal necessary as the catalyst.

Figure 10:
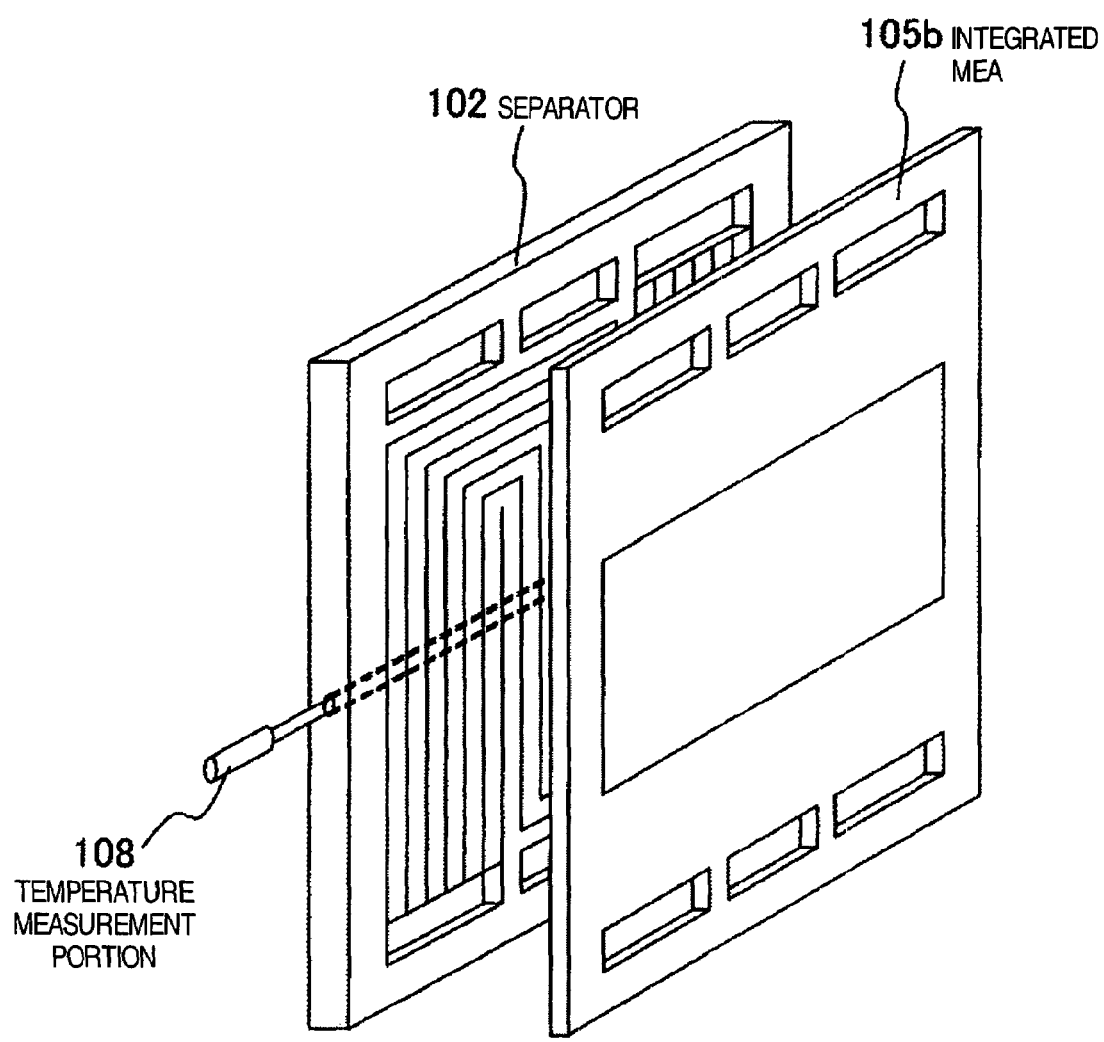
FIG. 10 is an explanatory view when abnormality occurring in a specific cell disposed in the voltage detection portion or at a part of the fuel cell stack is detected by means of a temperature.

FIG. 10 shows an example of the case where abnormality occurring in the detection portion or in a specific cell provided to a part of the fuel cell stack is detected by means of the temperature. Reference numeral 108 denotes a temperature measurement portion. A thermo-couple or a temperature sensor of a semiconductor type or other type is arranged in a thin tubular shape. The tubular shape is employed so that it can be inserted into the hole formed in the separator 102. The distal end of the tube can be positioned to a desired position inside the separator by adjusting the length of the tubular shape. The temperature detection portion is arranged at the distal end position of this tube and the measurement of the temperature at a desired position of the separator can be adjusted. Since abnormality of the fuel cell stack appears not only in the voltage but also in the temperature, the abnormality detection can be rendered reliable by detecting the temperature. An abnormal rise of the temperature, in particular, should be avoided for the sake of safety and the direct temperature measurement avoids this trouble. The abnormality detection by the temperature alone can be made but can be made more reliably by combining the abnormality detection by the temperature with the abnormality detection by the voltage.

The voltage detection portion according to this embodiment can improve detection accuracy by making contrivance to the internal structure of the voltage detection portion and the measurement method. The voltage detection portion may have the detachable structure shown in FIG. 6, for example. The cell of the voltage detection portion is so constituted as to exhibit abnormality in an earlier stage than in the cells of the power generation portion. Therefore, cell degradation may be quick depending on the control method but the detachable structure makes it possible to independently exchange only the voltage detection portion while the cells of the power generation portion are left as such.

Control for avoiding abnormality can of course be made quickly as long as the occurrence of abnormality can be detected accurately in the very initial stage. Therefore, abnormality can be removed before significant influences of degradation on the voltage detection portion appear in the voltage detection portion and cell degradation of the voltage detection portion can be suppressed, too. For example, it is possible to constitute the voltage detection portion of this embodiment into the construction in which the frequency component within a predetermined frequency range is extracted from the voltage detected from the voltage detection portion and the existence/absence of abnormality of the fuel cell stack or abnormality of the system inclusive of this fuel cell stack may be diagnosed. In this case, the unstable phenomenon of the voltage of the voltage detection portion occurring earlier than in the cells of the power generation portion can be accurately detected by extracting the characteristic frequency component. Therefore, the effect is great in early detection of the abnormality condition. In addition, the cause of abnormality can be easily stipulated by separating the signals for each frequency range and conducting the diagnosis processing.

Embodiment 3

Figure 11:
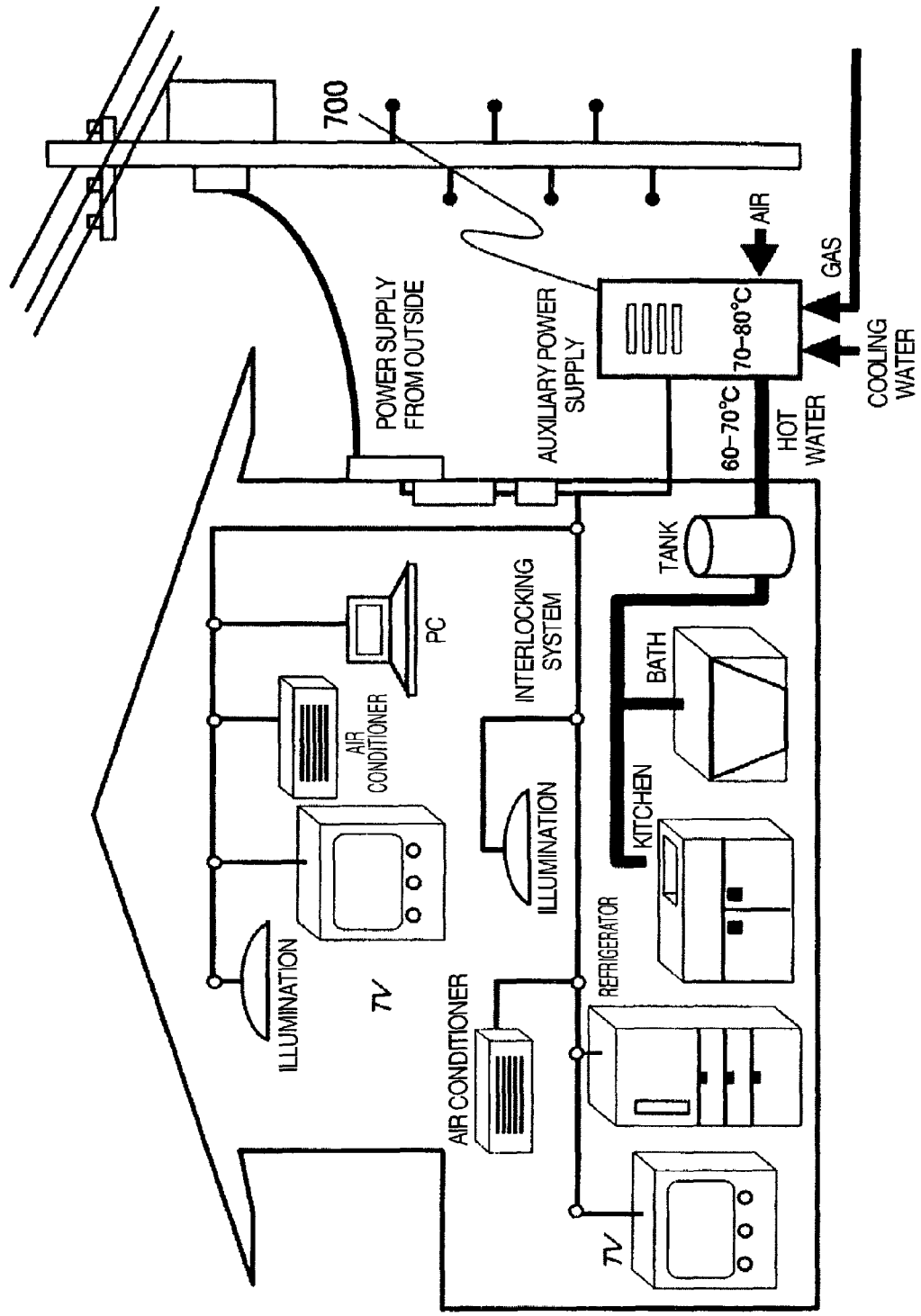
FIG. 11 is an explanatory view when a fuel cell power generation system according to an embodiment of the invention is applied to a stationary type distributed power source that is distributed to each home.

FIG. 11 shows an example when the fuel cell power generation system is applied to a stationary type distributed power source arranged in each home. Reference numeral 700 denotes a stationary type distributed power source that contains at least partially the fuel cell system according to the invention. An operation as a cogeneration system is hereby assumed. In this system, the reformer (hydrogen production apparatus) produces hydrogen by using the gas and air supplied from outside and pure water created as a result of the fuel cell power generation or ion exchanged water created from service water. A natural gas containing methane as its main component or a service gas can be used as the starting gas. A propane gas or other fuel may be supplied from a gas bomb. It is known that when the service gas is used, the sulfur component contained in an odorant poisons the catalyst. Therefore, the gas is supplied to the catalyst reaction portion through a desulfurizer. The feature when the fuel cell is used for the stationary type distributed power source resides in that not only power can be generated but also hot water obtained by exhaust heat of the fuel cell can be provided. In the case of a solid polymer type fuel cell, the temperature is about 70 to about 80° C. at the time of power generation and the temperature inside the fuel cell is adjusted by using cooling water, or the like. Hot water can be obtained by recovering heat created by the reaction of the fuel cell and by the internal resistance by cooling. When water supplied from outside is directly used for cooling the fuel cell, however, impurities contained in this water may exert adverse influences on the fuel cell. In such a case, water supplied from outside is indirectly heated by using an apparatus having a heat exchange function. Hot water so heated reaches about 50 to 60° C., for example, and can be used at kitchen, bath and toilet facilities by storing it in a tank. In addition, electric power acquired by power generation can be used for driving various home electric appliances in addition to service electricity from outside and the feed amount of electricity can be reduced. Needless to say, required electricity can be secured when the system has a sufficient power generation capacity without power supplied from outside.

A heater may be installed separately when the temperature of water supplied from outside is low and the temperature rise is not sufficient or when the temperature of water inside the tank drops. The heater can use heat energy by burning a part of the starting gas supplied from outside, for example, to heat water. The temperature of water fed can be heated to and kept at a predetermined temperature by feedback control that adjusts the heating quantity and the flow velocity of hot water. A similar system may be constituted by combining a commercially available additional heating boiler.

When the fuel cell power generation system according to the invention is applied to the stationary type distributed power source for home use, necessary detection information can be acquired even when the number of the monitor positions is decreased in the abnormality diagnosis of the fuel cells and the fuel cell system. Therefore, long-term service life expected for the home use system can be easily secured through a compact construction by detecting abnormality in an early stage and appropriately conducting avoiding control while the cost is suppressed to a low level.

The fuel cell system according to the invention can detect quickly and accurately the change of the voltage and executes the feedback control for quickly avoiding the abnormal state after the abnormality diagnosis is made. Therefore, the condition of the system inclusive of the fuel cell stack can be recovered to the normal state and degradation of the performance of the entire fuel cell stack inclusive of the voltage detection portion can be suppressed. Particularly, the voltage detection portion 1 employs in some cases the arrangement for achieving easy detection of abnormality (Embodiment 1) and the construction for achieving easy detection of abnormality (Embodiment 2) but when the feedback control for quickly avoiding the abnormal condition is executed after the accurate detection of abnormality described above, the abnormal condition can be recovered to the normal condition in the stage in which abnormality occurring in the voltage detection portion 1 yet remains extremely small and significant deterioration within a short period can be eliminated. In other words, degradation of the performance of the detection portion can be suppressed by combining the appropriate feedback control while the sensitivity of the abnormality detection portion is increased. In this case, at the point at which abnormality starts occurring in the voltage detection portion, abnormality hardly occurs in other power generation portions. Therefore, degradation of the entire fuel cell stack does not occur.

Here, concrete control methods based on the abnormality diagnosis include the following methods.

First, the voltage Vd for diagnosis in the voltage detection portion is processed to diagnose the occurrence of abnormality and when the occurrence is detected, the current control amount of the fuel cell stack 100 is quickly lowered. When the current value is lowered, the fuel utilization ratio of the fuel cell stack 100 is relatively lowered. In consequence, the burden that may otherwise result in degradation of the cell stack is quickly mitigated with the occurrence of abnormality and the system operation can be stably continued. The long-term system operation can thus be made.

This control relating to the current amount may be executed for a predetermined period of time and may be then returned to the original current amount after the passage of this predetermined time. Alternatively, the current amount may be returned to the original amount after the diagnosis is made to the effect that the abnormal condition is recovered.

The reason why the current control amount is lowered in the method described above is as follows. In the practical system operation, various abnormal conditions can be assumed such as the case where the feed gas composition from the modifier or its flow rate becomes improper, the case where water stays inside the cell stack, the case where the gas leakage amount (cross leak) increases through the electrolyte membrane, the case where the electrode catalyst of the cell stack is poisoned, and so forth. In these cases of abnormality, the current must be lowered when the feed gas composition or its flow rate becomes improper because the net hydrogen feed amount decreases. When water stays inside the cell stack, the flow and diffusion of the gas is impeded by water and hydrogen cannot be supplied locally inside the cell stack. In such a case, the current is preferably lowered. When the gas leak amount (cross leak) increases through the electrolyte membrane, the amount of hydrogen that effectively contributes to power generation decreases and the current must be lowered. When the electrode catalyst of the cell stack is poisoned or gets degraded, the catalyst contributing to power generation decreases and the current is preferably lowered. In this way, the operating condition that may otherwise deteriorates remarkably the cell stack can be quickly avoided in many cases of abnormality by lowering the current amount below a rated set value.

When abnormality is detected, the current of the fuel cell stack is lowered by a predetermined amount as an urgent countermeasure as the feedback control of the system and the individual feedback control is preferably made for avoiding abnormality in accordance with the cause of abnormality that is diagnosed. The feedback control for avoiding abnormality that is executed in succession to the current control of the fuel cell stack concretely depends on the construction of each system. When the temperature of the modifier portion of the modifier is not suitable, for example, a method that changes the charging amount of the starting fuel is available and when the heat recovery amount of the cooling water system is not suitable, a method that changes the water circulation amount of the cooling system is available.

When the cause of abnormality diagnosed is temperature abnormality of the reformer, for example, the return hydrogen amount to the modifier increases, on the contrary, when the current of the fuel cell stack is excessively lowered, the system operation becomes unstable in some cases. In such a case, it is possible to appropriately reflect the result of the abnormality diagnosis on the current control so as to relatively decrease the current lowering amount of the fuel cell stack on the basis of the diagnosis result. When the burner temperature rises excessively, on the contrary, the return hydrogen amount of the burner can be relatively decreased by increasing the current amount and recovery of the heat balance can be promoted. It is of course possible not to change the current amount when the change of the current amount is not desired.

To stipulate in detail the cause of abnormality, information such as temperatures and pressures separately detected from the modifier, auxiliaries or other portions may be referred to in combination with the result of the abnormality diagnosis according to the invention. When the oscillation frequency component inherent to the change of the modified gas composition occurs in the voltage of the voltage detection portion 1, for example, abnormality of the CO gas concentration in the reformer gas should be doubted. Therefore, the control for lowering the current amount of the fuel cell stack is first executed. In this instance, the temperature of the CO oxidation removal portion of the reformer is further looked up and when the temperature is about to come off from the proper temperature zone, the information is synthesized and the judgment is made to the effect that the reaction in the CO oxidation removal portion is about to become improper. Therefore, the feed air amount and the feed water amount to the CO oxidation removal portion are either increased or decreased to recover the abnormal condition so as to promote recovery to the stable operating condition (normal condition). In the judgment described above, the information as to whether the D.C. component of the voltage of the voltage detection portion drifts may further be combined for the judgment.

As described above, when any abnormality of the fuel cell stack or the system is detected by the diagnosis in the stationary type distributed power source for home use to which the fuel cell system of the invention is applied, the current taken out from the fuel cell is changed by the predetermined amount through the control and by so doing, the burden that may result in degradation of the fuel cell stack can be reduced and the system operation can be stably continued. The current amount can be appropriately set in accordance for each cause of abnormality detected. When this control of the current amount is executed for the predetermined period of time, a suitable value can be set to the length of this period for each cause of abnormality detected.

Figure 12:
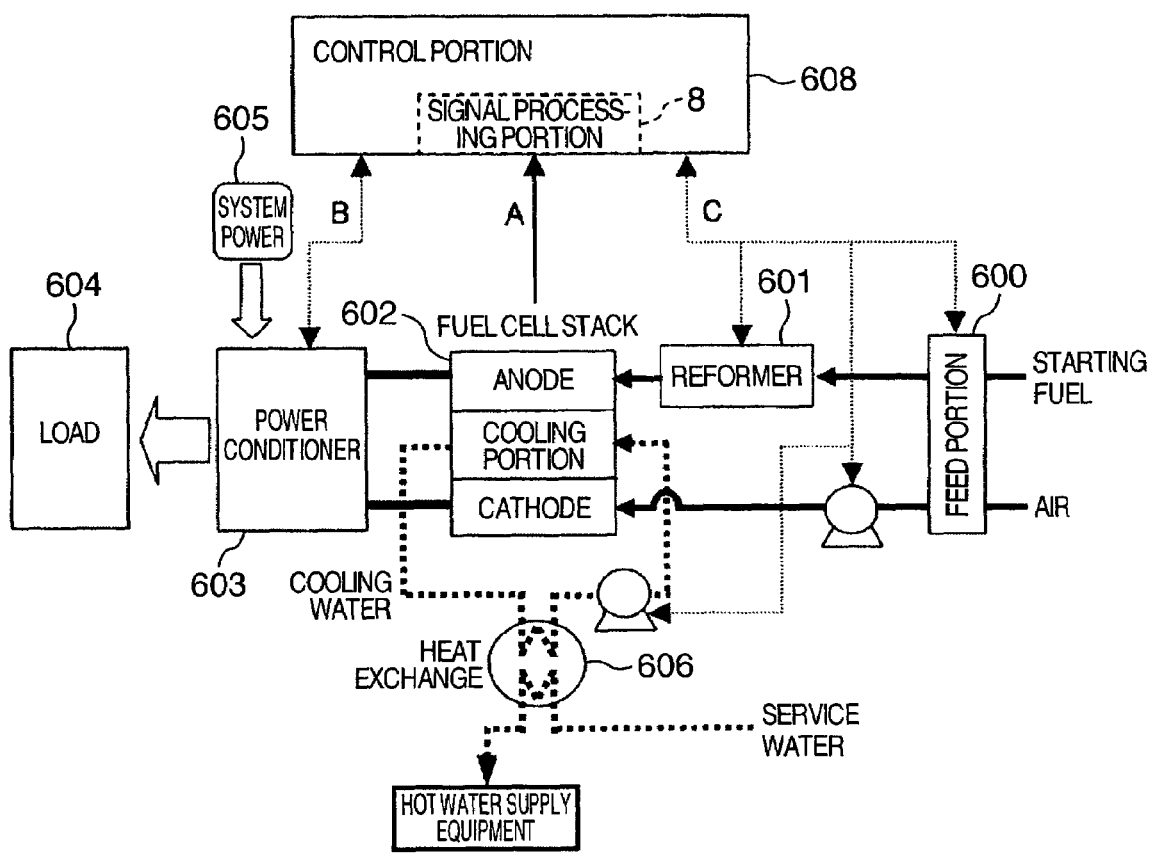
FIG. 12 is a schematic view showing an outline of a construction of a fuel cell co-generation system for home use and its control system.

FIG. 12 schematically shows the construction of the fuel cell cogeneration system for home use and its control system. A modifier 601 supplies hydrogen to a fuel cell stack 602. A power conditioner 603 such as an inverter takes out electric power necessary for a user load 604. The modifier 601 supplies various starting fuels in accordance with its modification system and generates a hydrogen-containing gas (modified gas) from the starting fuel through the catalytic reaction, or the like. In FIG. 12, feed auxiliaries such as the starting fuel are altogether represented by a feeder 600. The power conditioner 603 may be regarded as controlling the value of the current taken out from the fuel cell stack 602, for example. The power conditioner 603 acquires necessary power from system power 605 when the generation quantity of the fuel cell is not sufficient and thus bears the role of power management. Air is also supplied to the fuel cell stack 602 and power is generated from the modified gas and air as the starting materials. Heat generated by power generation is recovered by a heat recovery apparatus for circulating cooling water, for example, and keeps the stack temperature substantially constant at the time of power generation. Heat recovered in this way can heat service water through a heat exchanger 606 and water so heated can be supplied as hot water or stored. Though not shown in the drawing, hydrogen that remains without being fully consumed by the fuel cell stack is again returned to the reformer 601 and is burnt to keep the temperature necessary for the reaction.

In FIG. 12, signals transmitted to and received by the control portion 608 are schematically represented by dotted lines. A greater number of signals are sometimes used in the practical system but only a part is extracted and shown in FIG. 12 for ease of illustration. The signal A is a signal for diagnosis that is obtained from the voltage detection portion of the stack. The signal B is a signal for monitoring the condition of the power conditioner 603 and setting a control current quantity of the power conditioner 603. The signal C is a signal for controlling valves and auxiliaries and detecting the temperature of the modifier 601. The drawing shows the case where a signal processing portion 8 is constituted as a part of the control portion 608.

In the fuel cell system to which the abnormality diagnosis of the embodiment of the invention is applied, the signal processing for the abnormality diagnosis is executed on the basis of the signal A and the control current amount of the power conditioner 603 can be reduced by the signal B, for example. Consequently, the fuel cell stack 602 is prevented from being insufficient in hydrogen, degradation of the fuel cell till recovery of the abnormal condition can be suppressed and the stable operation can be carried out for a long period.

Since the return hydrogen amount to the reformer 601 increases when the control current amount to the power conditioner 603 decreases, it is sometimes preferred to change the feed amount of the starting fuels to the modifier 601. In such a case, the feed starting fuel amount to the reformer 601 may be controlled in match with the change component of the control current amount of the power conditioner 603. When the cause of abnormality can be stipulated or focused as a result of the abnormality analysis, the optimum control for recovery can be executed for each cause by using the signal C.

The fuel cell system and the abnormality diagnosis method according to the invention can be applied to fuel cell systems other than the system for home use. Because these systems have a compact construction and can conduct early detection of abnormality and proper avoiding control while suppressing the cost, the stable operation can be easily continued. When the current amount control described above is employed in combination, the burden that may result in degradation of the fuel cell stack can be quickly mitigated together with the detection of abnormality and the system operation can be continued stably.

While preferred embodiments of the invention have thus been described, it would be obvious to those skilled in the art that various changes and modifications may be made without departing from the spirit of the invention and the scope of the appended claims.

The invention claimed is:

1. A fuel cell system including a fuel cell stack, said system comprising:
voltage detection means for detecting a voltage of a portion of said fuel cell stack by using a voltage detection portion;
signal processing means for extracting a frequency component within a predetermined frequency range corresponding to a specific abnormality in said fuel cell system from said voltage detected by said voltage detection means, and for diagnosing the existence/absence of a periodical abnormality of said fuel cell stack or said system containing said fuel cell stack from the size of said extracted frequency component; and
power conditioning means which receives a result of said diagnosis of a periodical abnormality which is executed by the said signal processing means, and controls the current of said fuel stack based on the result of said diagnosis of a periodical abnormality.

2. A fuel cell system according to claim 1, wherein said diagnosis means:
extracts frequency components of at least two predetermined frequency ranges from the voltage detected by said voltage detection means; and
diagnoses the existence/absence of abnormality of said fuel cell stack or said system containing said fuel cell stack from the sizes of said extracted frequency components of said at least two predetermined frequency ranges.

3. A fuel cell system according to claim 2, wherein said diagnosis means:
diagnoses abnormality of said fuel cell stack from at least one extracted frequency component; and
diagnoses abnormality of a hydrogen production apparatus from at least one other extracted frequency component.

4. A fuel cell system according to claim 1, wherein for a predetermined period of time, said diagnosis means overlaps said extracted frequency component with at least one control signal associated with at least one of fuel feed means of said fuel cell system, a reformer, control means of said reformer, said fuel cell stack, a heat recovery system, control means of said heat recovery system and a power conditioner;
diagnoses the existence/absence of abnormality of said fuel cell stack or said system containing said fuel cell stack on the basis of said overlap of said extracted frequency component and said control signal.

5. A fuel cell power generation system for home use that uses said fuel cell system according to claim 1.

6. A fuel cell system according to claim 1, wherein said voltage detection portion is situated at an end portion of the fuel cell stack.

7. A fuel cell system according to claim 1, wherein said voltage detection portion comprises no more than twenty cells.

8. A fuel cell system according to claim 7, wherein said voltage detection portion further comprises two voltage detection terminals and at least two separators to separate each cell from any other cell and from the voltage detection terminals.

9. A fuel cell system according to claim 8, wherein a cell comprises an integrated membrane-electrode assembly (MEA).

10. A fuel cell system according to claim 1, wherein said fuel cell stack comprises a plurality, of voltage detection portions.

11. A fuel cell system according to claim 10, wherein said voltage detection portion comprises no more than twenty cells.

12. A fuel cell system according to claim 10, wherein said voltage detection portions are situated at intermediate portions of the fuel cell stack.

13. A fuel cell system including a fuel cell stack, the system comprising:
a voltage detection portion that detects a voltage of a portion of the fuel cell stack;
a signal processing portion that extracts a frequency component within a predetermined frequency range corresponding to a specific abnormality in the fuel cell system from the voltage detected by the voltage detection portion, and diagnoses the existence/absence of a periodical abnormality of the fuel cell stack or the system containing the fuel cell stack in accordance with a size of the extracted frequency component; and
a power conditioning portion which receives a result of the diagnosis of a periodical abnormality which is executed by the signal processing portion, and controls the current of the fuel stack based on the result of the diagnosis of a periodical abnormality.

14. A fuel cell system according to claim 13, wherein the voltage detection portion is situated at an end portion of the fuel cell stack.

15. A fuel cell system according to claim 13, wherein said voltage detection portion comprises no more than twenty cells.

16. A fuel cell system according to claim 15, wherein the voltage detection portion further comprises two voltage detection terminals and at least two separators to separate each cell from any other cell and from the voltage detection terminals.

17. A fuel cell system according to claim 16, wherein a cell comprises an integrated membrane-electrode assembly (MEA).

18. A fuel cell system according to claim 13, wherein the fuel cell stack comprises a plurality of voltage detection portions.

19. A fuel cell system according to claim 18, wherein said voltage detection portion comprises no more than twenty cells.

20. A fuel cell system according to claim 18, wherein the voltage detection portions are situated at intermediate portions of the fuel cell stack.

21. The fuel cell system according to claim 1, wherein the predetermined frequency range includes a range of several millihertz to several decades of millihertz.

22. The fuel cell system according to claim 13, wherein the predetermined frequency range includes a range of several millihertz to several decades of millihertz.

* * * * *

UNITED STATES PATENT AND TRADEMARK OFFICE
CERTIFICATE OF CORRECTION

PATENT NO. : 7,695,838 B2
APPLICATION NO. : 11/244237
DATED : April 13, 2010
INVENTOR(S) : M. Komachiya et al.

It is certified that error appears in the above-identified patent and that said Letters Patent is hereby corrected as shown below:

Title Page, at Item (*) Notice: delete "This patent is subject to a terminal disclaimer."

Signed and Sealed this
Twenty-fourth Day of July, 2012

David J. Kappos
*Director of the United States Patent and Trademark Office*